(12) United States Patent
Jeong et al.

(10) Patent No.: US 9,793,165 B2
(45) Date of Patent: Oct. 17, 2017

(54) METHODS OF FABRICATING SEMICONDUCTOR DEVICES

(75) Inventors: Seyoung Jeong, Suwon-si (KR); Taeje Cho, Hwaseong-si (KR); Hogeon Song, Suwon-Si (KR); Kyu-Ha Lee, Yongin-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 13/345,441

(22) Filed: Jan. 6, 2012

(65) Prior Publication Data

US 2012/0214302 A1    Aug. 23, 2012

(30) Foreign Application Priority Data

Feb. 21, 2011   (KR) ........................ 10-2011-0015162

(51) Int. Cl.
*H01L 21/768* (2006.01)
*H01L 21/683* (2006.01)
(Continued)

(52) U.S. Cl.
CPC ...... *H01L 21/76898* (2013.01); *H01L 21/486* (2013.01); *H01L 21/6835* (2013.01); *H01L 23/147* (2013.01); *H01L 23/3171* (2013.01); *H01L 23/3192* (2013.01); *H01L 23/49827* (2013.01); *H01L 24/73* (2013.01); *H01L 25/0657* (2013.01); *H01L 25/105* (2013.01); *H01L 23/3128* (2013.01); *H01L 24/05* (2013.01); *H01L 24/06* (2013.01); *H01L 24/13* (2013.01); *H01L 24/16* (2013.01); *H01L 24/17* (2013.01); *H01L 24/48* (2013.01); *H01L 24/81* (2013.01); *H01L 2221/6834* (2013.01); *H01L 2221/68327* (2013.01);
(Continued)

(58) Field of Classification Search
CPC ......... H01L 21/76898; H01L 21/76883; H01L 21/486
USPC ......................................... 438/667
See application file for complete search history.

(56) References Cited

U.S. PATENT DOCUMENTS 4,590,327 A * 5/1986 Nath et al. .............. 136/256
6,809,421 B1 * 10/2004 Hayasaka et al. ............ 257/777
(Continued)

FOREIGN PATENT DOCUMENTS

JP   2004297019   10/2004
JP   2007067216    3/2007
(Continued)

*Primary Examiner* — Jesse Y Miyoshi
*Assistant Examiner* — John Bodnar
(74) *Attorney, Agent, or Firm* — F. Chau & Associates, LLC

(57) ABSTRACT

A method of fabricating a semiconductor device is provided. The method may include preparing a substrate having a first surface and a second surface, forming a via hole exposing at least a portion of the substrate from the first surface of the substrate, forming a first insulating film on an inner wall of the via hole, forming a conductive connection part filling an inside of the via hole including the first insulating film, polishing the second surface of the substrate until the conductive connection part is exposed, and selectively forming a second insulating film on the second surface of the substrate using an electrografting method to expose the conductive connection part.

10 Claims, 22 Drawing Sheets

(51) Int. Cl.
  *H01L 25/065* (2006.01)
  *H01L 25/10* (2006.01)
  *H01L 23/14* (2006.01)
  *H01L 23/498* (2006.01)
  *H01L 21/48* (2006.01)
  *H01L 23/31* (2006.01)
  *H01L 23/00* (2006.01)

(52) U.S. Cl.
  CPC ........... *H01L 2221/68331* (2013.01); *H01L 2224/0401* (2013.01); *H01L 2224/04042* (2013.01); *H01L 2224/05008* (2013.01); *H01L 2224/05009* (2013.01); *H01L 2224/0557* (2013.01); *H01L 2224/05109* (2013.01); *H01L 2224/05139* (2013.01); *H01L 2224/05144* (2013.01); *H01L 2224/05147* (2013.01); *H01L 2224/05184* (2013.01); *H01L 2224/05568* (2013.01); *H01L 2224/05569* (2013.01); *H01L 2224/05571* (2013.01); *H01L 2224/05572* (2013.01); *H01L 2224/06181* (2013.01); *H01L 2224/131* (2013.01); *H01L 2224/13025* (2013.01); *H01L 2224/16146* (2013.01); *H01L 2224/16225* (2013.01); *H01L 2224/16227* (2013.01); *H01L 2224/16235* (2013.01); *H01L 2224/16237* (2013.01); *H01L 2224/17181* (2013.01); *H01L 2224/48157* (2013.01); *H01L 2224/48227* (2013.01); *H01L 2224/73257* (2013.01); *H01L 2224/73265* (2013.01); *H01L 2224/81815* (2013.01); *H01L 2225/0651* (2013.01); *H01L 2225/06513* (2013.01); *H01L 2225/06517* (2013.01); *H01L 2225/06541* (2013.01); *H01L 2225/06548* (2013.01); *H01L 2225/06565* (2013.01); *H01L 2225/06568* (2013.01); *H01L 2225/1023* (2013.01); *H01L 2225/1058* (2013.01); *H01L 2924/00014* (2013.01); *H01L 2924/157* (2013.01); *H01L 2924/15311* (2013.01); *H01L 2924/15788* (2013.01); *H01L 2924/181* (2013.01)

(56) References Cited

U.S. PATENT DOCUMENTS

| | | | |
|---|---|---|---|
| 7,094,701 B2 | 8/2006 | Umemoto et al. | |
| 7,288,481 B2* | 10/2007 | Nemoto | 438/667 |
| 7,646,079 B2 | 1/2010 | Umemoto | |
| 7,652,745 B2* | 1/2010 | Chae | G02F 1/1362 349/138 |
| 7,863,188 B2* | 1/2011 | Tsurume et al. | 438/667 |
| 7,994,048 B2* | 8/2011 | Komuro | 438/629 |
| 2004/0245623 A1 | 12/2004 | Hara et al. | |
| 2006/0211236 A1 | 9/2006 | Bureau et al. | |
| 2007/0052067 A1 | 3/2007 | Umemoto | |
| 2007/0281148 A1* | 12/2007 | Bureau | C09D 5/4476 428/336 |
| 2010/0032811 A1* | 2/2010 | Ding | H01L 21/6835 257/621 |
| 2010/0038800 A1 | 2/2010 | Yoon et al. | |
| 2010/0200989 A1* | 8/2010 | Sprey | H01L 21/02126 257/741 |
| 2011/0210444 A1* | 9/2011 | Jeng | H01L 23/13 257/738 |

FOREIGN PATENT DOCUMENTS

| | | |
|---|---|---|
| KR | 1020040084830 | 10/2004 |
| KR | 10-2005-0112083 | 11/2005 |
| KR | 10-2006-0050151 | 5/2006 |
| KR | 1020070026045 | 3/2007 |
| KR | 1020100021856 | 2/2010 |

* cited by examiner

METHODS OF FABRICATING SEMICONDUCTOR DEVICES

CROSS-REFERENCE TO RELATED APPLICATIONS

This U.S. non-provisional patent application claims priority under 35 U.S.C.§119 of Korean Patent Application No. 10-2011-0015162, filed on Feb. 21, 2011, the entire contents of which are herein incorporated by reference.

BACKGROUND

Embodiments of the present inventive concept herein relate to semiconductor devices and methods of fabricating the semiconductor devices, and more particularly, to semiconductor devices having a through silicon via (TSV) and methods of fabricating the semiconductor devices.

Demand for lightweight, small, high-speed, multifunctional, high-performance, and low-cost electronic products calls for a multi-chip stacking and packaging technology or a system-in-package technology. The multi-chip stacked package technology or the system-in-package technology uses a through silicon via.

A multi-chip stacked package or a system-in package may perform functions of a plurality of unit semiconductor devices in one semiconductor package. The multi-chip stacked package or the system-in package may be used for products, such as a cell phone, a notebook computer, a memory card, or a portable camcorder.

SUMMARY

An embodiment of the inventive concept provides a semiconductor device. The semiconductor device may include a substrate having a first surface, a second surface, and a via hole penetrating the substrate, a first insulating film provided on an inner sidewall of the via hole, a conductive connection part filling the via hole, and a second insulating film selectively provided on the second surface of the substrate to expose the conductive connection part. The second insulating film extends toward the conductive connection part. An end of the second insulating film extending toward the conductive connection part has a curved surface whose radius of curvature is at least half a thickness of the second insulating film.

An embodiment of the inventive concept provides a method of manufacturing a semiconductor device. The method may include preparing a substrate having a first surface and a second surface, forming a via hole exposing at least a portion of the substrate from the first surface of the substrate, forming a first insulating film on an inner wall of the via hole, forming a conductive connection part filling the inside of the via hole including the first insulating film, polishing the second surface of the substrate until the conductive connection part is exposed, and selectively forming a second insulating film on the second surface of the substrate using an electrografting method to expose the conductive connection part.

An embodiment of the inventive concept provides a method of fabricating a semiconductor device comprising preparing a substrate having an integrated circuit, forming a pad on a top surface of the substrate, wherein the pad is connected to the integrated circuit, forming a via hole through the top surface of the substrate at a predetermined depth, forming a first insulating film on an inner wall of the via hole, forming a conductive connection part that fills the via hole and extends on the top surface to be connected to the pad, exposing the conductive connection part, and forming a second insulating film on the polished bottom surface of the substrate except for the exposed connection part.

BRIEF DESCRIPTION OF THE FIGURES

The embodiments of the inventive concept will be apparent from the following detailed description, as illustrated in the accompanying drawings in which like reference characters may refer to the same or substantially the same parts throughout the drawings and the specification. The drawings are not necessarily to scale, emphasis instead being placed upon illustrating the principles of the inventive concept. In the drawings, the thickness of layers and regions are exaggerated for clarity.

DETAILED DESCRIPTION OF THE EMBODIMENTS

Figure 1:
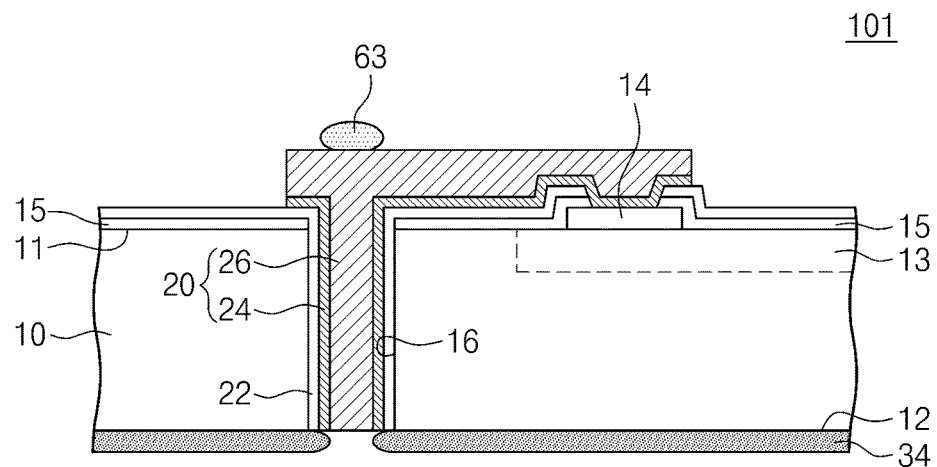
FIG. 1 is a cross sectional view of a semiconductor device in accordance with an embodiment of the inventive concept.

Exemplary embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout. In the drawings, the thickness of layers and regions are exaggerated for clarity.

It will be understood that when an element is referred to as being "on" or "connected to" another element, it can be directly on or connected to the other element or intervening elements may be present.

FIG. 1 is a cross sectional view of a semiconductor device in accordance with an embodiment of the inventive concept. Referring to FIG. 1, a substrate 10 of a semiconductor device 101 includes a first surface 11 and a second surface 12 facing the first surface 11. The semiconductor device 101 may be a semiconductor chip including an integrated circuit 13. The substrate 10 may include a semiconductor substrate and an integrated circuit. The integrated circuit 13 is provided in the substrate 10. The integrated circuit 13 may be formed inside the first surface 11 of the substrate 10. The integrated circuit 13 may include a stack of devices that are able to be integrated and systematized. The integrated circuit 13 may include a transistor or a memory device.

A pad 14 electrically connected to the integrated circuit 13 may be provided on the integrated circuit 13. The pad 14 may be formed of aluminum (Al) or copper (Cu). When the pad 14 is formed of aluminum, the pad 14 may be provided on the integrated circuit 13. When the pad 14 is formed of copper, the pad 14 may have a damascene structure and may be included in the integrated circuit 13.

The substrate 10 including the pad 14 may further include a passivation film 15 exposing a portion of the pad 14 on the first surface 11. The passivation film 15 may protect the integrated circuit 13 from an external environment. The passivation film 15 may be formed of a silicon oxide, a silicon nitride, or a combination thereof.

A via hole 16 for forming a through silicon via 20 is spaced apart from the integrated circuit 13 and penetrates the substrate 10. The via hole 16 may be provided in a peripheral circuit region (not illustrated) or a scribe lane region. The via hole 16 may also be formed to penetrate the pad 14 or to overlap the pad 14.

A via hole insulating film 22 may be provided on a sidewall of the via hole 16. The via hole insulating film 22 may include a silicon oxide, a silicon oxynitride, a silicon nitride, polymer or combinations thereof. The via hole insulating film 22 may be a silicon oxide film or a polymer film. The polymer film may be a CF-based polymer film. The CF-based polymer film may be formed by a plasma process using at least one selected from $C_4F_6$, $C_4F_8$, $C_5F_8$, $CHF_3$, and a combination thereof. The CF-based polymer film may have a dielectric constant lower than a silicon oxide. The CF-based polymer film has a dielectric constant of about 2.5, and the silicon oxide has a dielectric constant of about 3.6. The via hole insulating film 22 may extend from a sidewall of the via hole 16 onto the passivation film 15. According to an embodiment, the via hole 22 may expose a portion of the pad 14 together with the passivation film 15. When the via hole insulating film 22 is the CF-based polymer film, the via hole insulating film 22 may be provided only on a sidewall of the via hole 16.

The through silicon via 20 may be provided in the via hole 16. At this time, the via hole insulating film 22 is interposed between the via hole 16 and the through silicon via 20. The through silicon via 20 may extend on the first surface 11 of the substrate 10 and may be electrically connected to the pad 14. The through silicon via 20 may include a barrier film 24 formed on the via hole insulating film 22, and a conductive connection part 26 formed on the barrier film 24. The barrier film 24 may include titanium (Ti), titanium nitride (TiN), tantalum (Ta), or tantalum nitride (TaN). The barrier film 24 may prevent a conductive material of the conductive connection part 26 from diffusing into the substrate 10. The conductive connection part 26 may include silver (Ag), gold (Au), copper (Cu), tungsten (W), or indium (In).

A connection pattern 63 may be provided on the through silicon via 20, and the connection pattern 63 may be formed using a solder material. When semiconductor devices are stacked, the connection pattern 63 may reflow to connect the through silicon vias of the semiconductor devices to each other. The connection pattern 63 may be formed to correspond to a position at which the via hole 16 is formed.

A surface insulating film 34 is provided on a second surface 12 of the substrate 10. The surface insulating film 34 may prevent the second surface 12 of the substrate 10 from being contaminated by conductive material when forming a conductive bump (66 of FIG. 14) that is electrically connected to the conductive connection part 26 at the second surface 12 of the substrate 10. The surface insulating film 34 may include a polyvinyl-based material. The surface insulating film 34 may be formed using an electrografting method. Accordingly, the surface insulating film 34 may be selectively provided so that the surface insulating film 34 is in direct contact with the second surface 12 of the substrate to expose the conductive connection part 26.

The surface insulating film 34 may extend toward the conductive connection part 26. An end of the surface insulating film 34 extending toward the conductive connection part 26 may have a curved surface whose radius of curvature is at least half a thickness of the surface insulating film 34. For example, the surface insulating film 34 may cover a portion of the via hole insulating film 22 and/or a portion of the barrier film 26.

The surface insulating film 34 is selectively provided on the second surface 12 of the substrate 10 except a portion on which the conductive connection part 26 is provided, and thereby a photolithography etching process to remove insulating films formed on the through silicon via 20 may be omitted. When exposing the through silicon via 20 using a photolithography etching process, if the through silicon via 20 has a narrow width (for example, the via hole 16 has a narrow width), it is not easy to remove the insulating films formed on the through silicon via 20 because of a limit to resolution of photolithography etching process. According to an embodiment of the inventive concept, the through silicon via 20 may be easily exposed regardless of a width of the through silicon via 20.

Hereinafter, referring to FIGS. 2 through 5, semiconductor devices in accordance with embodiments of the inventive concept are described. FIGS. 2 through 5 are cross sectional views of semiconductor devices in accordance with embodiments, respectively.

Figure 2:
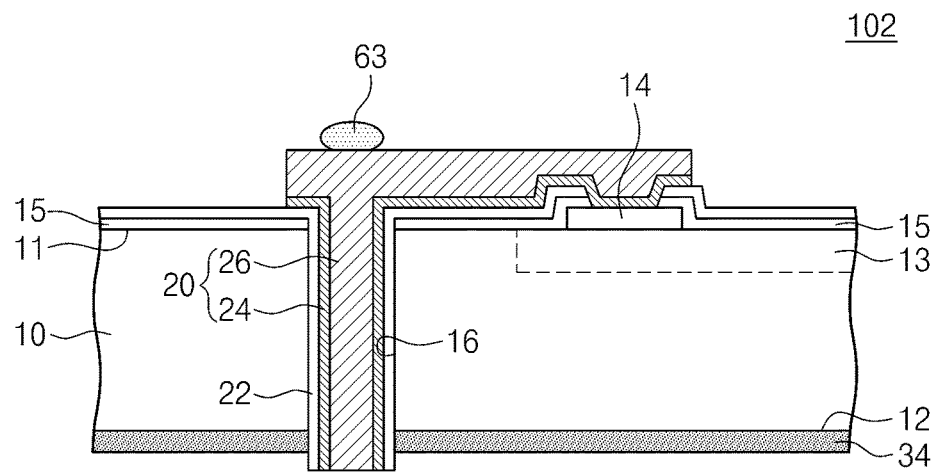
FIG. 2 is a cross sectional view of a semiconductor device in accordance with an embodiment of the inventive concept.

A semiconductor device 102 of FIG. 2 is different from the semiconductor device 101 of FIG. 1 in that a through silicon via 20 and a via hole insulating film 22 protrude from a second surface 12 of a substrate 10, which may be caused due to differences in etch rates between the substrate 10 and the through silicon via 20 during a planarization process for exposing the through silicon via 20 to the second surface 12 of the substrate 10.

A surface insulating film 34 may be provided only on the second surface 12 of the substrate 10 except a portion on which the through silicon via 20 is provided since when the surface insulating film 34 is formed by an electrografting method, an applied current for an electrografting reaction is cut off by the via hole insulating film 22 interposed between the through silicon via 20 and the substrate 10. According to an embodiment, when an electrografting reaction for forming the surface insulating film 34 is performed for a sufficient time, the surface insulating film 34 may be coplanar with the through silicon via 20.

Figure 3:
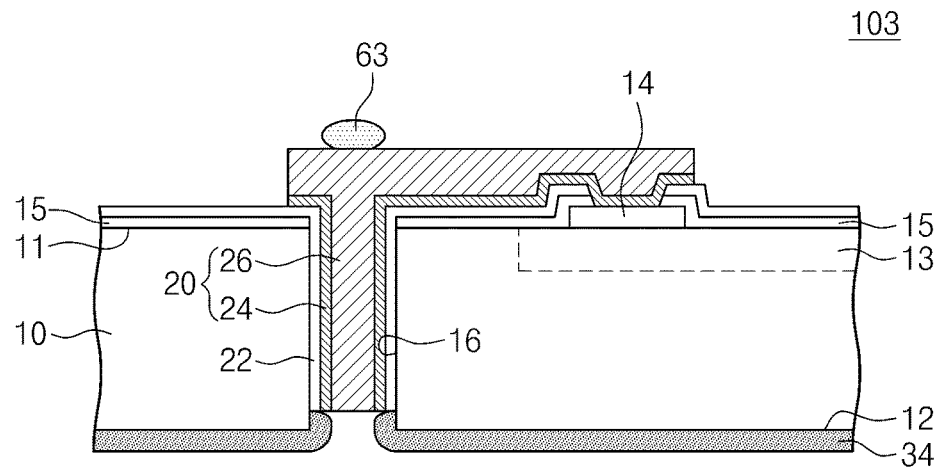
FIG. 3 is a cross sectional view of a semiconductor device in accordance with an embodiment of the inventive concept.

A semiconductor device 103 of FIG. 3 is different from the semiconductor device 101 of FIG. 1 in that a through silicon via 20 and a via hole insulating film 22 are recessed from a second surface 12 of a substrate 10, which may be attributed to differences in etch rates between the substrate 10 and the through silicon via 20 during a planarization process for exposing the through silicon via 20 to the second surface 12 of the substrate 10.

A surface insulating film 34 may be provided on the second surface 12 of the substrate 10 so that the surface insulating film 34 extends from the second surface 12 of the substrate 10 to a recessed portion since an electrografting reaction may occur in the substrate 10 exposed to a sidewall of a via hole 16 of the recessed portion from the second surface 12 of the substrate 10 when the surface insulating film 34 is formed by an electrografting method.

Figure 4:
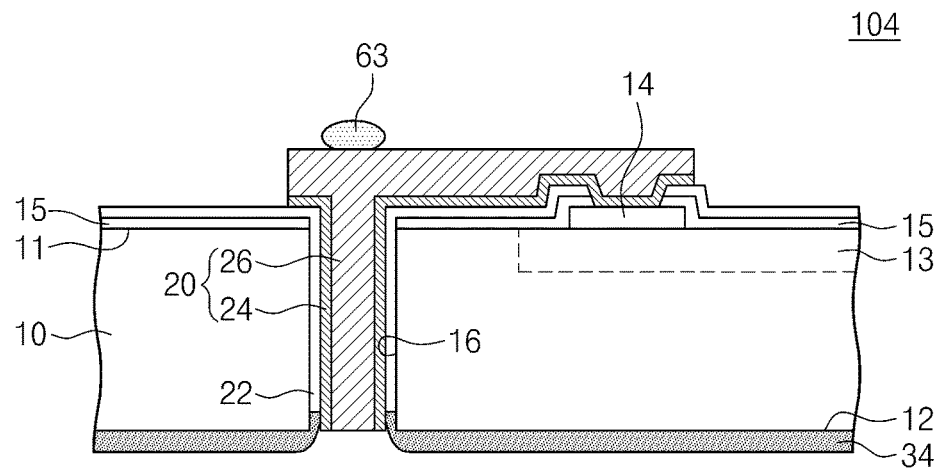
FIG. 4 is a cross sectional view of a semiconductor device in accordance with an embodiment of the inventive concept.

A semiconductor device 104 of FIG. 4 is different from the semiconductor device 101 of FIG. 1 in that the a via hole insulating film 22 is recessed from a second surface 12 of a substrate 10, which may be caused due to differences in etch rates between the substrate 10 and the via hole insulating film 22 when performing a planarization process for exposing a through silicon via 20 to the second surface 12 of the substrate 10.

A surface insulating film 34 may be provided on the second surface 12 of the substrate 10 so that the surface insulating film 34 extends toward a portion where the via hole insulating film 22 is recessed from the second surface 12 of the substrate 10 since an electrografting reaction may occur in the substrate 10 exposed to a sidewall of a via hole 16 of the recessed portion from the second surface 12 of the substrate 10 when the surface insulating film 34 is formed by an electrografting method.

Figure 5:
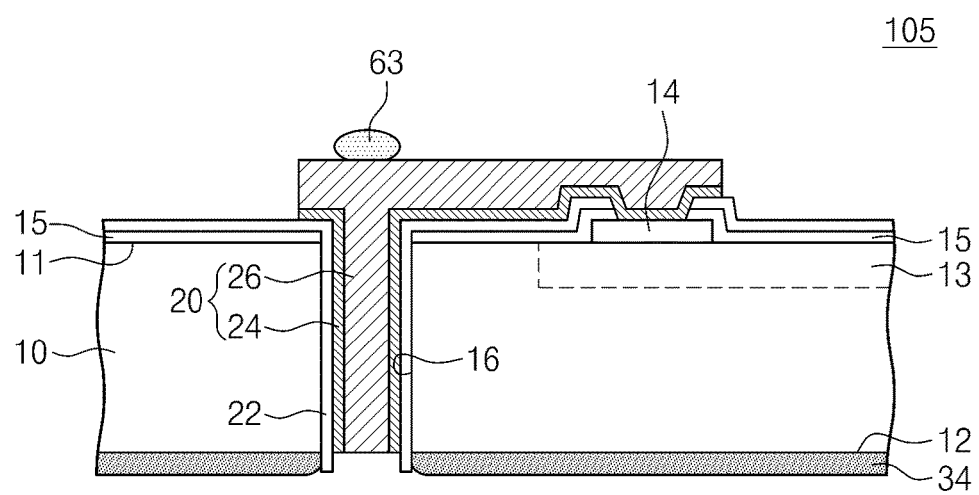
FIG. 5 is a cross sectional view of a semiconductor device in accordance with an embodiment of the inventive concept.

A semiconductor device 105 of FIG. 5 is different from the semiconductor device 101 of FIG. 1 in that a via hole insulating film 22 protrudes from a second surface 12 of a substrate 10, which may occur due to differences in etch rates between the substrate 10 and the via hole insulating film 22 upon a planarization process for exposing a through silicon via 20 to the second surface 12 of the substrate 10.

A surface insulating film 34 may be provided only on the second surface 12 of the substrate 10 except a portion on which the through silicon via 20 is provided since when the surface insulating film 34 is formed by an electrografting method, an applied current for an electrografting reaction is cut off by the via hole insulating film 22 interposed between the through silicon via 20 and the substrate 10. According to an embodiment, when an electrografting reaction for forming the surface insulating film 34 is performed for a sufficient time, the surface insulating film 34 may be coplanar with the via hole insulating film 22.

Although not illustrated in the drawings, according to an embodiment, an insulating film having a different structure from those illustrated in FIGS. 1 through 5 may be applied to a surface insulating film. The surface insulating films of different structures may be determined by various electrografting process conditions.

According to the embodiments of the inventive concept, an insulating film is selectively provided on one side of a semiconductor substrate except a portion on which a through silicon via of a semiconductor device is provided and an electrical characteristic and reliability of the semiconductor device may be thereby improved.

A method of fabricating the semiconductor device shown in FIG. 1 is described with reference to FIGS. 1 and 6 to 12. FIGS. 6 through 12 are cross sectional views illustrating a method of fabricating a semiconductor device in accordance with an embodiment of the inventive concept.

Figure 6:
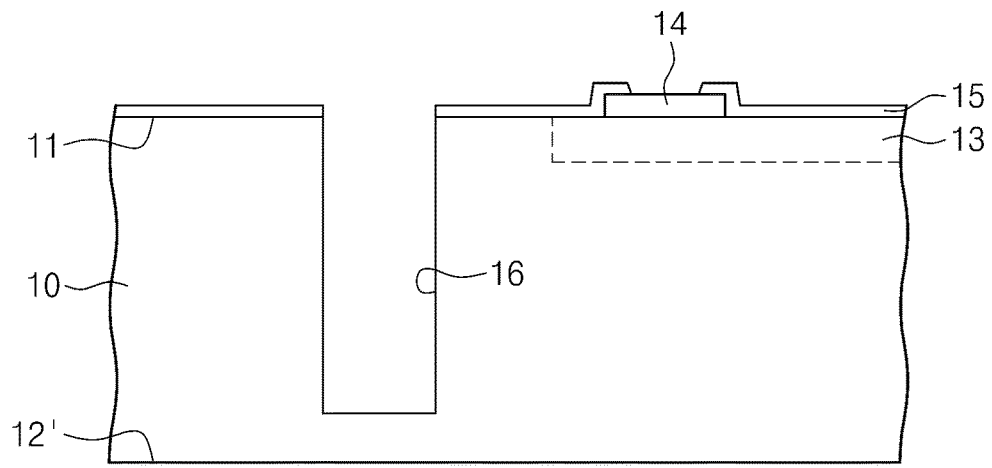
FIGS. 6 through 12 are cross sectional views illustrating a method of fabricating a semiconductor device in accordance with an embodiment of the inventive concept.
Figure 11:
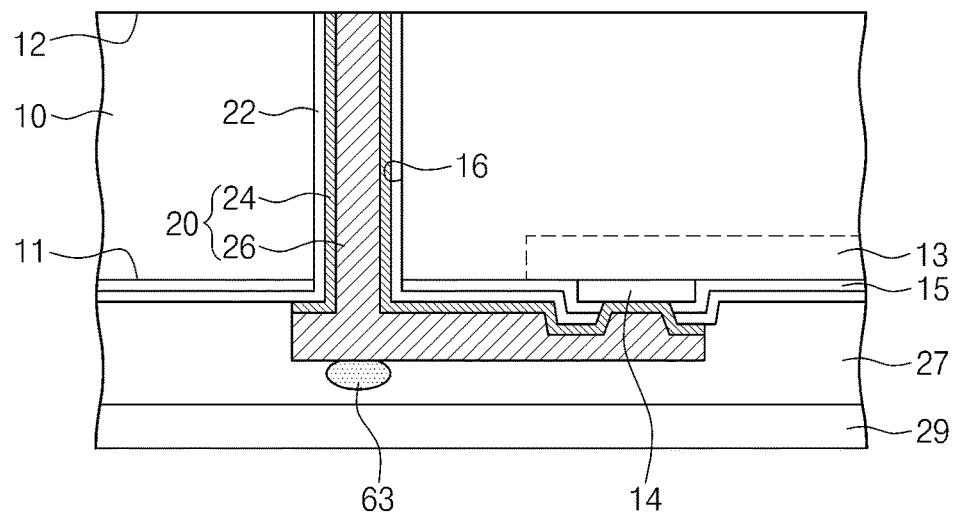

Referring to FIG. 6, an integrated circuit 13 is formed in a substrate 10 or on a first surface 11 of substrate 10. A pad 14 electrically connected to the integrated circuit 13 is formed on the integrated circuit 13. The integrated circuit 13 may be formed before forming the pad 14. When the pad 14 is formed of, for example, aluminum, the pad 14 may be formed on the integrated circuit 13 as illustrated in FIG. 11. When the pad 14 is formed of, for example, copper, the pad 14 may be formed as a damascene structure to be included in the integrated circuit 13.

A passivation film 15 exposing a part of the pad 14 may be formed on the first surface 11 of the substrate 10 including the pad 14. The passivation film 15 may protect the integrated circuit 13 from an external environment. The passivation film 15 may be formed of a silicon oxide, a silicon nitride, or a combination thereof.

A via hole 16 is formed which is recessed to a predetermined depth from the first surface 11 of the substrate 10. The via hole 16 may be formed in a peripheral circuit region (not illustrated) or a scribe lane region. The via hole 16 may also be formed to penetrate the pad 14 or overlap the pad 14. The via hole 16 may be formed using a dry etching process, a wet etching process, or a drilling process, such as laser drilling or mechanical drilling. A depth of the via hole 16 is greater than a thickness of the integrated circuit 13 and is smaller than a thickness of the substrate 10 so that the via hole 16 may be spaced apart from an initial second surface 12'.

Figure 7:
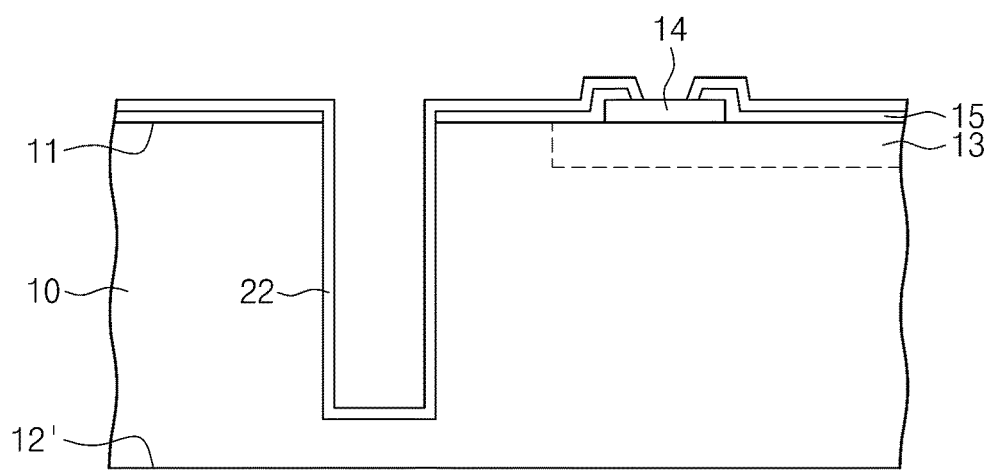

Referring to FIG. 7, a via hole insulating film 22 is formed on an inner surface of the via hole 16. The via hole insulating film 22 may extend from the inner surface of the via hole 16 onto the first surface 11 of the substrate 10. A portion of the via hole insulating film 22 formed on the pad 14 is removed using a photolithography etching process to expose a portion of the pad 14.

The via hole insulating film 22 may include a silicon oxide film, a silicon oxynitride film, a silicon nitride film, a polymer film, or a combination thereof. The polymer film may be a CF-based polymer film. The CF-based polymer film may be formed by a plasma process using at least one selected from $C_4F_6$, $C_4F_8$, $C_5F_8$, $CHF_3$, and a combination thereof.

When the via hole insulating film 22 is the silicon oxide film, the silicon oxynitride film or the silicon nitride film, the via hole insulating film 22 may extend from the inner surface of the via hole 16 onto the first surface 11 of the substrate 10. When the via hole insulating film 22 is the CF-based polymer film, the via hole insulating film 22 is formed only on the inner surface of the via hole 16 and does not extend onto the first surface 11 of the substrate 10.

Forming the via hole insulating film 22 of the CF-based polymer film may include exposing the via hole 16 to a plasma process using a CF-based gas. The CF-based gas may include at least one selected from $C_4F_6$, $C_4F_8$, $C_5F_8$, CHF$_3$, and a combination thereof. A CF-based polymer ((CF$_2$)$_n$) may be created by a CF$_x$ ingredient generated from a plasma process using the CF-based gas to form the via hole insulating film 22 on a sidewall of the via hole 16.

The via hole insulating film 22 may have a multilayer insulating film structure that includes a first insulating film, such as the silicon oxide film, the silicon oxynitride film, or the silicon nitride film, and a second insulating film including the polymer film.

Figure 8:
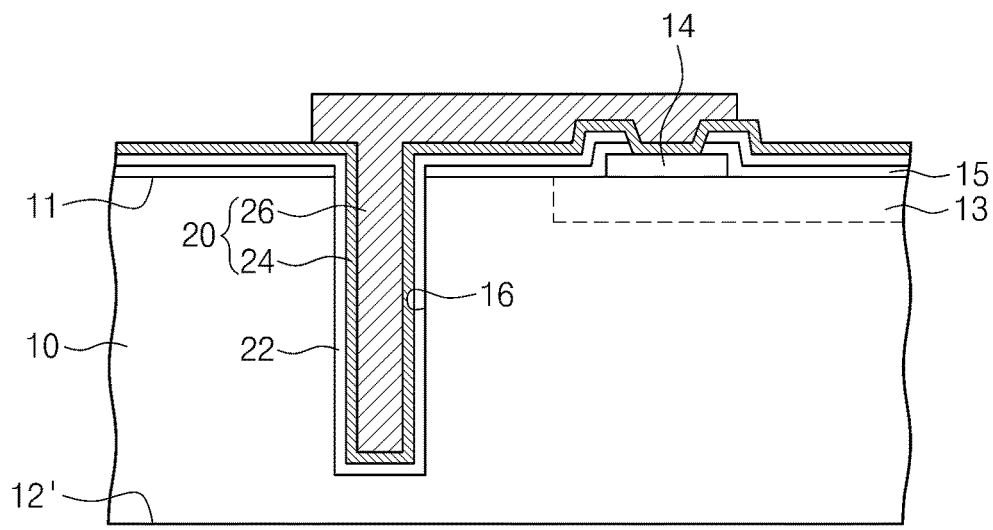

Referring to FIG. 8, a barrier film 24 may be formed along the inner surface of the via hole 16 in which the via hole insulating film 22 is formed. The barrier film 24 may include titanium, titanium nitride, tantalum, or tantalum nitride. The barrier film 24 may prevent metal of a through silicon via interconnection pattern from diffusing into the substrate 10.

A conductive connection part 26 is formed by filling an inside of the via hole 16 with a through silicon via interconnection pattern and by patterning the through silicon via interconnection pattern. The conductive connection part 26 may be formed in the via hole 16 using an electroplating method, an electroless plating method, or a selective deposition method. An electroplating method may include forming a seed layer along the inner surface of the via hole 16 including the barrier film 24 and plating the interconnection pattern using the seed layer. The seed layer may be formed by a sputtering method. The conductive connection part 26 may include silver, gold, copper, tungsten, or indium. The conductive connection part 26 may extend on the first surface 11 of the substrate 10 so that the conductive connection part 26 is electrically connected to the pad 14. Also, the conductive connection part 26 may be formed to penetrate the pad 14 or to overlap the pad 14.

Figure 9:
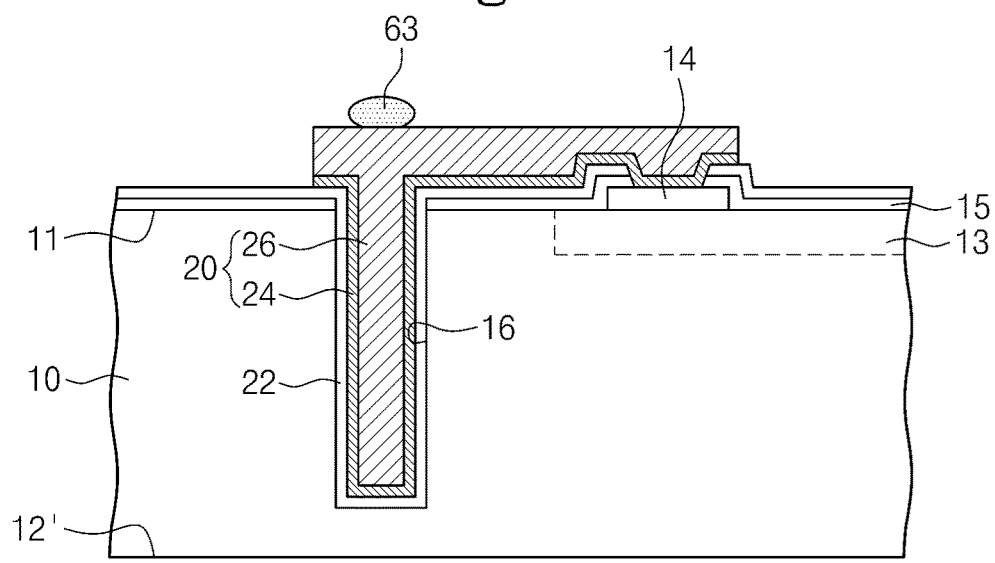

Referring to FIG. 9, a portion of the barrier film 24, which is not covered by the conductive connection part 26, may be removed by using the conductive connection part 26 as a mask. The removal of the barrier film 24 may be performed using a dry etching process or a wet etching process. Thereafter, a connection pattern 63 may be formed on the conductive connection part 26. The conductive connection pattern 63 may be a solder ball.

Figure 10:
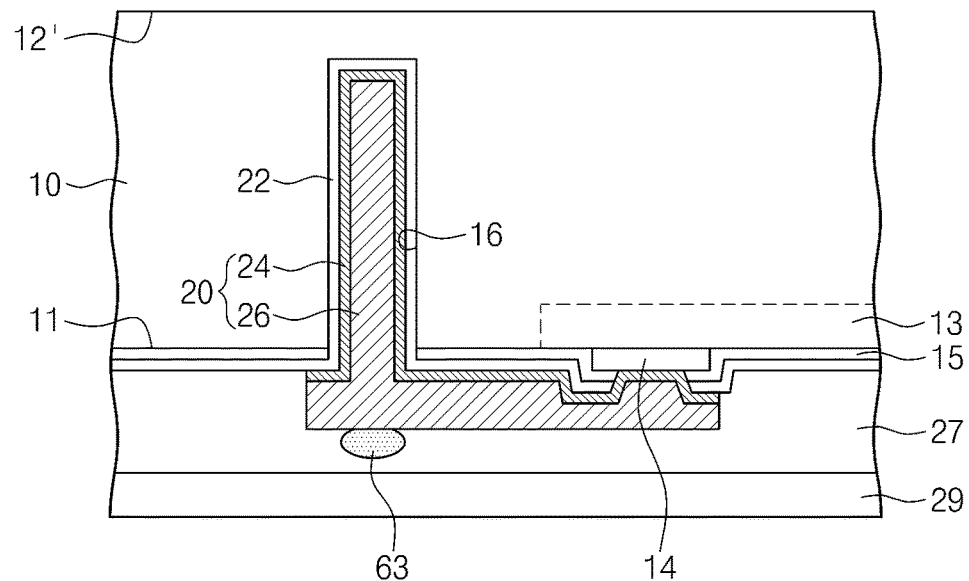

Referring to FIG. 10, the initial second surface 12' of the substrate 10 is polished. A carrier substrate 29 may be adhered to the first surface 11 of the substrate 10 using an adhesion layer 27. The carrier substrate 29 may relieve a mechanical stress applied to the substrate 10 while polishing the initial second surface 12' of the substrate 10 and may prevent bending from occurring at the thinned substrate 10 after the polishing process. The carrier substrate 29 may include a glass substrate or a resin substrate, and the adhesion layer 27 may include an ultraviolet adhesive or a thermoplastic adhesive. The initial second surface 12' of the substrate 10 is polished until the via hole insulating film 22 is exposed. Polishing the initial second surface 12' of the substrate 10 may be performed using, for example, a grinding method. A polished second surface may be higher or lower than the via hole insulating film 22.

Referring to FIG. 11, the polished second surface of the substrate 10 is selectively etched to form a second surface 12. The conductive connection part 26 surrounded by the via hole insulating film 22 is exposed through the second surface 12 of the substrate 10. The substrate 10 may be selectively etched using a dry etching process or a wet etching process having a large etching selectivity with respect to the via hole insulating film 22. For example, when the via hole insulating film 22 is a silicon oxide film, the substrate 10 may be selectively etched using a SF$_6$ etching gas.

Figure 12:
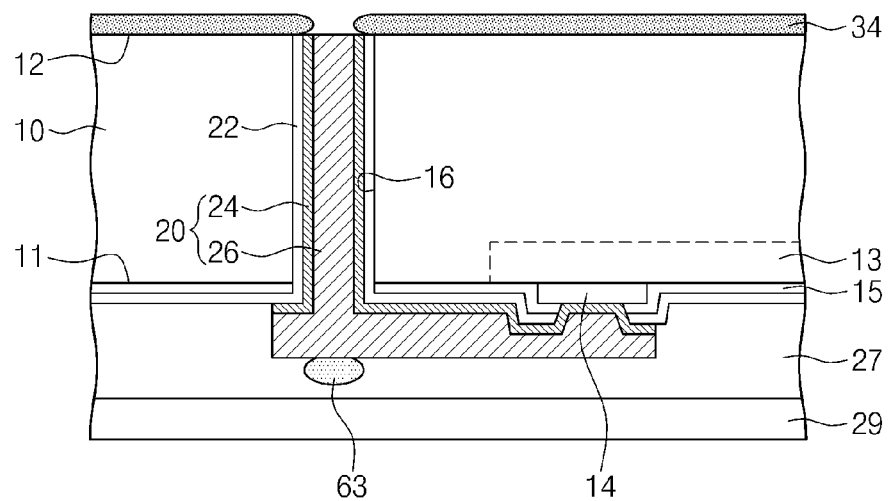

Referring to FIG. 12, using an electrografting method, a surface insulating film 34 is selectively formed on the second surface 12 of the substrate 10 except a portion where the conductive connection part 26 is formed. The surface insulating film 34 may be formed of, for example, a polyvinyl-based material film. The electrografting method forms a nano level thin film on a surface of a conductor or semiconductor. More specifically, as the substrate 10 is waterlogged in a wet organic precursor and electrons emitted from a surface of the substrate 10 to which a current is applied function as a bonding seed for an organic precursor molecule, the electrons are grafted on the surface of the substrate 10 by a covalent bonding to form a thin film. According to the electrografting method, various types of thin films may be formed on the surface of conductor or semiconductor.

The surface insulating film 34 may extend toward the conductive connection part 26. An end of the surface insulating film 34 extending toward the conductive connection part 26 may have a curved surface having a radius of curvature of at least half a thickness of the surface insulating film 34. For example, the surface insulating film 34 may cover a portion of the via hole insulating film 22 and/or a portion of the barrier film 24.

Referring back to FIG. 1, as the conductive connection part 26 is exposed, the conductive connection part 26 may be connected to a through silicon via of another semiconductor device. After forming the surface insulating film 34, the carrier substrate 29 and the adhesion layer 27 may be removed. According to an embodiment, a planarization process may be performed with the barrier film 24 remaining on an upper portion of the conductive connection part 26.

According to an embodiment of the inventive concept, the surface insulating film 34 is selectively provided on the second surface 12 of the substrate 10 except a portion where the conductive connection part 26 is provided, thereby eliminating the need for performing a photolithography etching process to remove the insulating film that would otherwise remain on the conductive connection part 26. When exposing the through silicon via 20 using a photolithography etching process, if the conductive connection part 26 has a narrow width (for example, the via hole 16 has a narrow width), removal of an insulating film formed on the conductive connection part 26 may be difficult because of a limit to resolution of photolithography etching process. According to an embodiment of the inventive concept, the conductive connection part 26 may be easily exposed regardless of a width of the conductive connection part 26.

According to an embodiment of the inventive concept, although a process of forming a conductive bump (66 of FIG. 14) electrically connected to the conductive connection part 26 of the second surface 12 of the substrate 10 is performed, since the second surface 12 of the substrate 10 is covered with the surface insulating film 34, the substrate 10 is protected from possible contamination.

Methods of fabricating the semiconductor devices described with reference to FIGS. 2 through 5 are similar to the fabricating method described in connection with FIGS. 1 and 6 to 12. However, as shown in FIGS. 2 to 5, different structures may occur due to differences in etch rates among the substrate 10, the through silicon via 20, and the via hole insulating film 22 when performing a planarization process for exposing the conductive connection part 26 to the second surface 12 of the substrate 10, as shown in FIG. 11. By the different structures described above, the surface insulating film 34 selectively formed on the second surface 12 of the substrate 10 except a portion on which the conductive connection part 26 is formed may have various types as shown in FIGS. 2 through 5.

Figure 13:
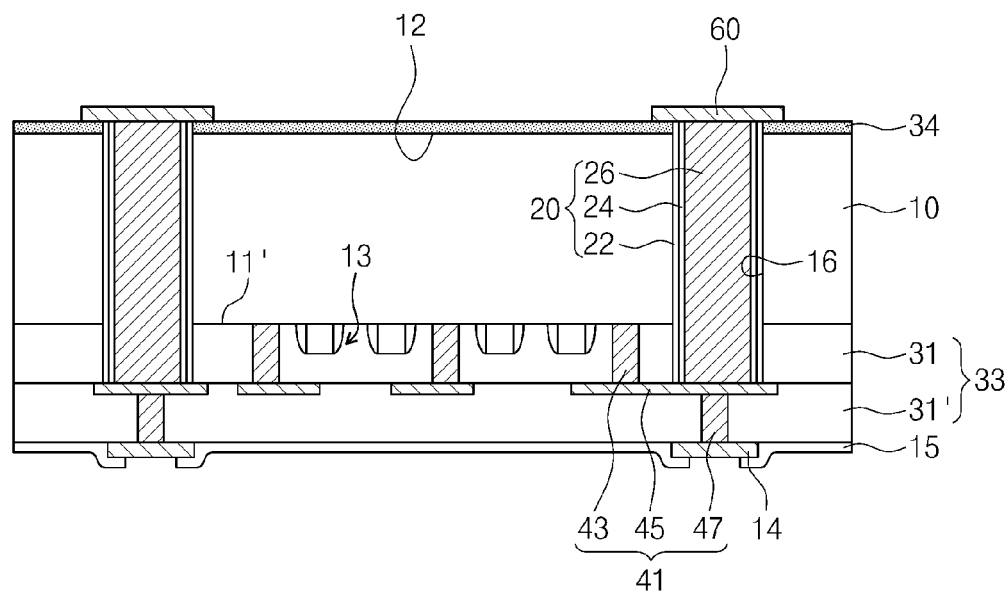
FIG. 13 is a cross sectional view of a semiconductor device in accordance with an embodiment of the inventive concept.

FIG. 13 is a cross sectional view of a semiconductor device in accordance with an embodiment of the inventive concept.

Referring to FIG. 13, a semiconductor device 106 includes a semiconductor substrate 10, which is, for example, a silicon substrate. The semiconductor substrate 10 may include a first surface 11' and a second surface 12 facing the first surface 11'. The semiconductor device 106 may include an integrated circuit 13 formed on the first surface 11' of the semiconductor substrate 10. The type of the integrated circuit 13 may vary depending on the semiconductor device 106. For example, the integrated circuit 13 may include at least one of a memory circuit, a logic circuit, and combinations thereof. The integrated circuit 13 may be a passive device including a resistor or a capacitor.

A via hole 16 is formed to be spaced apart from the integrated circuit 13 and to penetrate the semiconductor substrate 10. The via hole 16 has a same diameter from the first surface 11' of the substrate 10 to the second surface 12 of the substrate 10. The via hole 16 may also have two diameters or more. The via hole 16 may also have a tapered shape such that a diameter gradually varies.

A through silicon via 20 may fill at least a portion of the via hole 16. The through silicon via 20 may be connected to the integrated circuit 13 of the semiconductor device 106. The through silicon via 20 may also be used to connect the semiconductor device 106 to another semiconductor device or to connect the semiconductor device 106 to a package substrate or a module substrate. The through silicon via 20 may include a barrier film 24 formed on an inner sidewall of the via hole 16 and a conductive connection part 26 formed on the barrier film 24. The conductive connection part 26 may fill at least a portion of the via hole 16. The conductive connection part 26 may have a protrusive portion protruding from the second surface 12 of the semiconductor substrate 10. A via hole insulating film 22 may be provided between the semiconductor substrate 10 exposed by the via hole 16 and the barrier film 24. The via hole insulating film 22 may include a silicon oxide, a silicon oxynitride, a silicon nitride, a polymer, or a combination thereof The polymer may be a CF-based polymer. The CF-based polymer may be formed by a plasma process using at least one selected from $C_4F_6$, $C_4F_8$, $C_5F_8$, $CHF_3$, and combinations thereof. The barrier film 24 may include a material that can prevent conductive material in the conductive connection part 26 from diffusing into the semiconductor substrate 10. For example, the barrier film 24 may include titanium, tantalum, titanium nitride, or tantalum nitride. The barrier film 24 may be formed by a sputter method. The conductive connection part 26 may include copper, tungsten, aluminum, silver, gold, indium, or polysilicon.

A surface insulating film 34 may be provided on the second surface 12 of the semiconductor substrate 10. The surface insulating film 34 may extend from the second surface 12 of the semiconductor substrate 10 onto the inner sidewall of the via hole 16. The surface insulating film 34 may include a polyvinyl-based material. The surface insulating film 34 may have the structures illustrated in FIGS. 1 through 5 according to a structure of the through silicon via 20.

A connecting pad 60 covering the conductive connection part 26 and at least a portion of the surface insulating film 34 may be provided on the second surface 12 of the semiconductor substrate 10. The connecting pad 60 may be directly connected to the conductive connection part 26.

An interlayer insulating film 33, which covers the first surface 11' of the semiconductor substrate 10 and the integrated circuit 13, and an internal interconnection 41, which connects the integrated circuit 13 with the pad 14, may be provided. The interlayer insulating film 33 may include a plurality of insulating films. For example, the interlayer insulating film 33 may include a first interlayer insulating film 31 covering the first surface 11' of the semiconductor substrate 10 and a second interlayer insulating film 31' formed on the first interlayer insulating film 31 to cover the integrated circuit 13. A passivation film 15 exposing a portion of the pad 14 may be provided on the interlayer insulating film 33. The internal interconnection 41 may include first and second contact plugs 43 and 47 penetrating at least a portion of the interlayer insulating film 33 and a second interconnection pattern 45 formed on or in the interlayer insulating film 33. For example, the second interconnection pattern 45 may be a first metal layer. The first and second contact plugs 43 and 47 and the second interconnection pattern 45 may be formed using a patterning method or a damascene method.

The semiconductor device 106 may be a semiconductor chip having a via middle structure in which the through silicon via 20 is formed after the integrated circuit 13 is formed. For example, after the integrated circuit 13, the first interlayer insulating film 31, and the first contact plug 43 are formed on the first surface 11' of the semiconductor substrate 10, the through silicon via 20 penetrating the semiconductor substrate 10 and the first interlayer insulating film 31 is formed. Thereafter, the second interconnection pattern 45 connecting the first contact plug 43 and the conductive connection part 26, the second contact plug 47, and the pad 14 may be formed.

The through silicon vias 20 described with reference to FIGS. 1 through 5 may be applied to an interposer (120 of FIG. 14). According to an embodiment, the integrated circuit 13 illustrated in FIG. 13 may not be formed.

Figure 14:
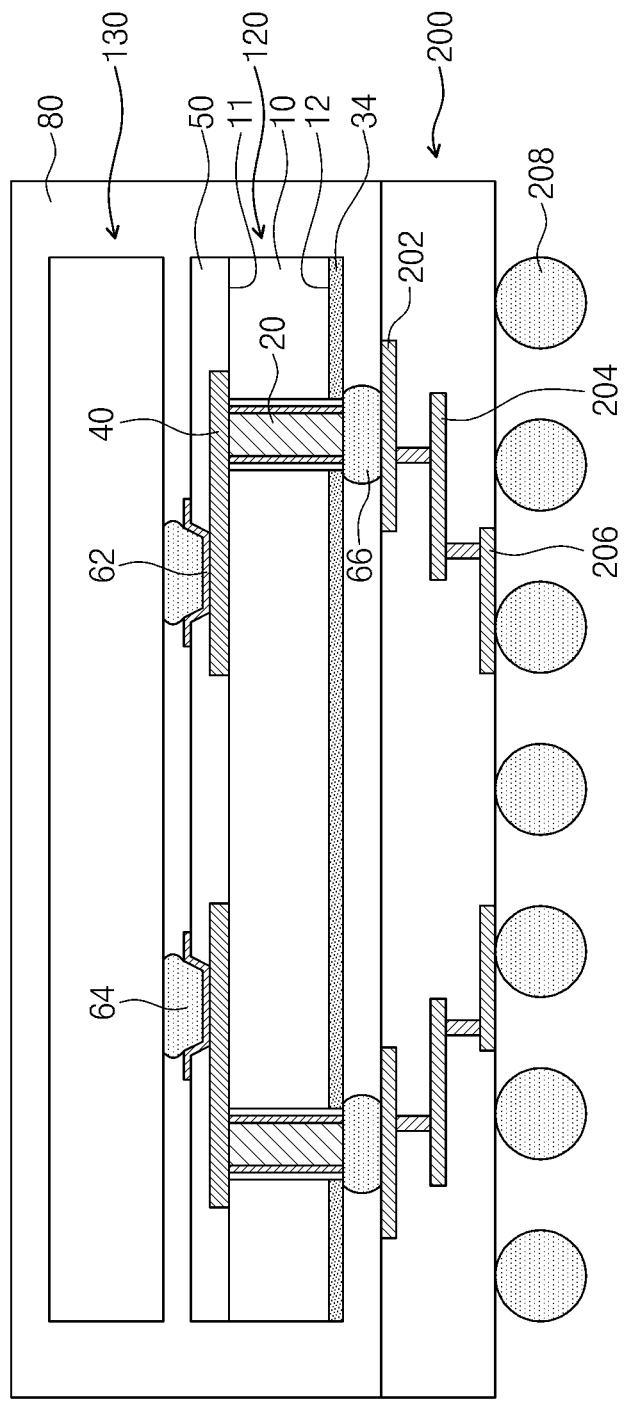
FIG. 14 is a cross sectional view of a semiconductor package including an interposer in accordance with an embodiment of the inventive concept.

FIG. 14 is a cross sectional view illustrating an interposer in accordance with an embodiment of the inventive concept and an application example of the interposer.

Referring to FIG. 14, a semiconductor substrate 10 may be a silicon substrate or a glass substrate. A second connecting terminal 66 may be formed on a second surface 12 of the semiconductor substrate 10. The second connecting terminal 66 may be selected from the group consisting of a conductive bump, a solder ball, a conductive spacer, a pin grid array (PGA), and combinations thereof.

A first interconnection layer 40 electrically connected to a through silicon via 20 and a second insulating film 50 covering the first interconnection layer 40 may be formed on a first surface 11 of the semiconductor substrate 10. The first interconnection layer 40 may be a redistributed interconnection for another semiconductor device which is to be stacked on an interposer 120. The second insulating film 50 may expose a portion of the first interconnection layer 40. An electrode pad 62 electrically connected to the exposed portion of the first interconnection layer 40 may be formed. According to an embodiment, there are provided a plurality of electrode pads 62 having different pitches from each other and a plurality of second connecting terminals 66 having different pitches from each other.

The interposer 120 may be mounted upside down on a package substrate 200. The package substrate 200 may be formed of a flexible printed circuit board in which a circuit pattern 204 is formed, a rigid printed circuit board in which a circuit pattern 204 is formed, or a combination thereof. The circuit pattern 204 may be connected to a bonding pad 202 or a ball pad 206.

The interposer 120 may be electrically connected to the bonding pad 202 through the second connecting terminal 66 and may be connected to an external connecting terminal 208 through the circuit pattern 204 of the package substrate 200.

Another semiconductor device 130 may be stacked on the interposer 120. The semiconductor device 130 may be electrically connected to the electrode pad 62 of the interposer 120 through a first connecting terminal 64. For example, the semiconductor device 130 may be a semiconductor chip, and the first connecting terminal 64 may be a flip-chip bump. When a plurality of first connecting terminals 64 and a plurality of through silicon vias 20 are formed, a distance between adjacent first connecting terminals 64 may be smaller than a distance between adjacent through silicon vias 20. When the semiconductor device 130 cannot be directly mounted on the bonding pad 202 of the package substrate 200 since a distance between the adjacent first connecting terminals 64 is small, the interposer 120 including the first interconnection layer 40 may be disposed between the semiconductor device 130 and the package substrate 200.

A protective material 80 covering whole or portion of the package substrate 200, the interposer 120, and the semiconductor device 130 may be further included. For example, the protective material 80 may be an underfill material filling at least a portion of a space between the interposer 120 and the package substrate 200 or a space between the interposer 120 and the semiconductor device 130, or may have a molding structure covering the interposer 120 and the semiconductor device 130. The molding structure may include an epoxy molding compound (EMC).

Figure 15:
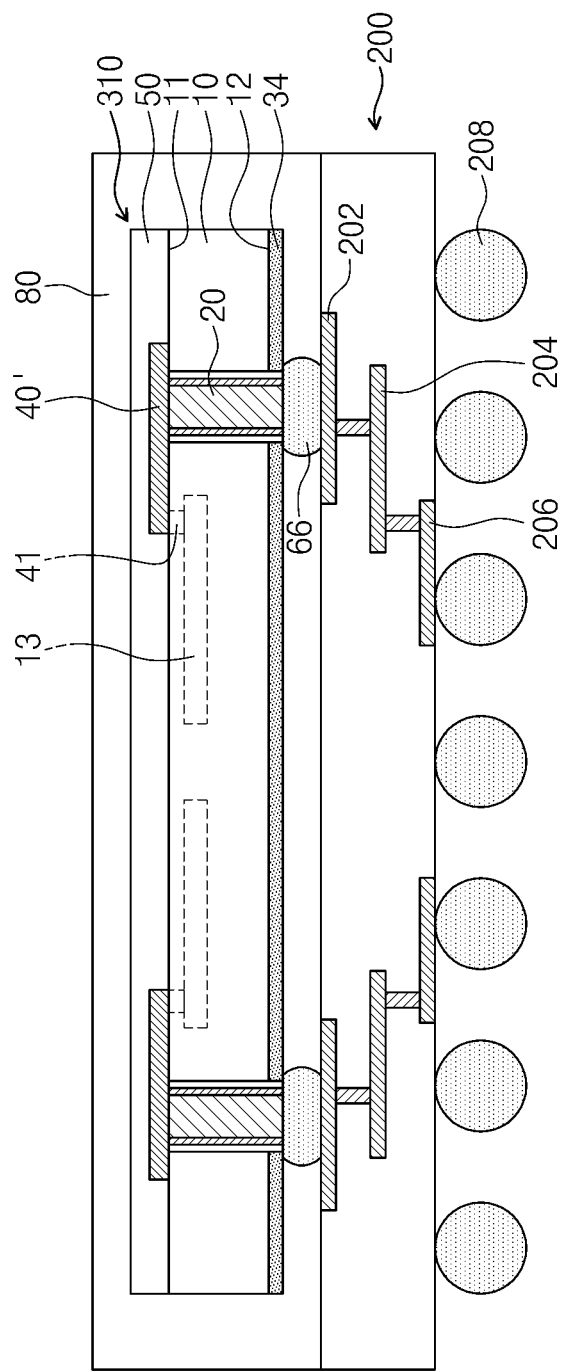
FIGS. 15 and 16 are cross sectional views of semiconductor packages in accordance with embodiments of the inventive concept.
Figure 16:
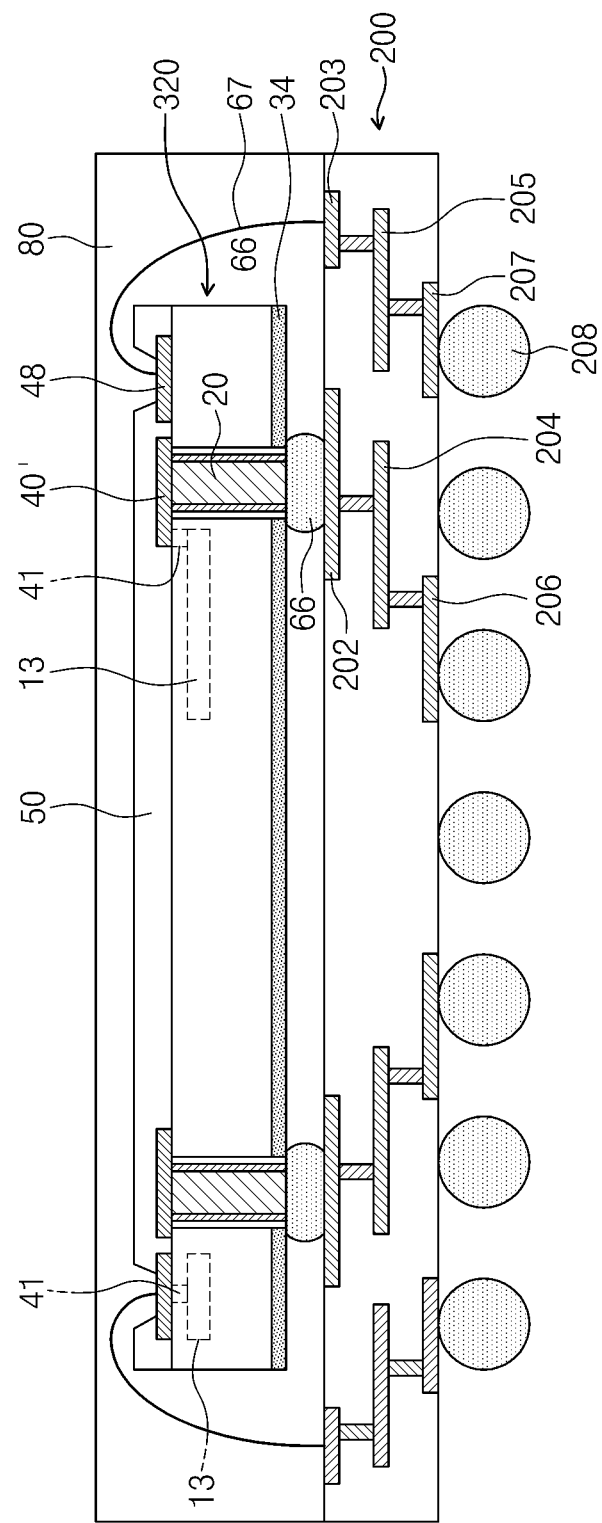

FIGS. 15 and 16 are cross sectional views of semiconductor packages in accordance with embodiments of the inventive concept.

Referring to FIG. 15, a semiconductor package in accordance with the inventive concept is described. The semiconductor device described with reference to FIG. 13 may be applied to a semiconductor chip 310. The semiconductor chip 310 may include an integrated circuit 13 formed in the semiconductor substrate 10 or on a first surface 11 of the semiconductor substrate 10. The integrated circuit 13 may be electrically connected to a through silicon via 20 through an internal interconnection 41 and a first interconnection layer 40'. A second insulating film 50 may be formed on the first interconnection layer 40'. The first interconnection layer 40' and the second insulating film 50 may have the same or similar structure as those described with reference to FIG. 13.

A package substrate 200 may be formed of a flexible printed circuit board in which a circuit pattern 204 is formed, a rigid printed circuit board in which a circuit pattern 204 is formed, or a combination thereof. The package substrate 200 may include a bonding pad 202 and a ball pad 206 at two sides of the package substrate 200. The bonding pad 202 and the ball pad 206 are exposed to the outside. The circuit pattern 204 may be connected to the bonding pad 202 and/or the ball pad 206. The semiconductor chip 310 may be mounted on the package substrate 200 so that a second surface 12 of the semiconductor substrate 10 faces the package substrate 200. The semiconductor chip 310 may be electrically connected to the bonding pad 202 through a second connecting terminal 66 and may be connected to an external connecting terminal 208 through the circuit pattern 204 of the package substrate 200 and the ball pad 206.

The semiconductor chip 310 may be mounted on the package substrate 200 so that the first surface 11 of the semiconductor substrate 10 faces the package substrate 200. The second insulating film 50 may be formed to expose at least a portion of the first interconnection layer 40', and the exposed portion of the first interconnection layer 40' may be electrically connected to the circuit pattern 204 of the package substrate 200 through a connecting terminal (not shown).

Referring to FIG. 16, a modified example of the semiconductor package shown in FIG. 15 is described. A package substrate 200 may include a second circuit pattern 205, a second bonding pad 203, and a second ball pad 207. The second bonding pad 203 and the second ball pad 207 are located at two sides of the package substrate 200 and are exposed to the outside of the package substrate 200. The second circuit pattern 205 may be connected to the second bonding pad 203 and the second ball pad 207.

A part of an integrated circuit 13 of a semiconductor chip 320 may be electrically connected to a through silicon via 20 through an internal interconnection 41 and a first interconnection layer 40'. A part of the integrated circuit 13 of the semiconductor chip 320 may be electrically connected to a bonding wire 67 through the internal interconnection 41 and a second interconnection layer 48. The first and second interconnection layers 40' and 48 and a second insulating film 50 may have the same or similar structure as those described with reference to FIG. 13. A part of the second interconnection layer 48 may be exposed by the second insulating film 50 and may be connected to the bonding wire 67. The semiconductor chip 320 may be electrically connected to the second circuit pattern 205 of the package substrate 200 through the bonding wire 67 and may be connected to an external terminal 208 through the second ball pad 207.

A signal transmitted through the through silicon via 20 may be different from a signal transmitted through the bonding wire 67. For example, the through silicon via 20 may transmit a power supply signal or a ground signal, and the bonding wire 67 may transmit a data signal. Alternatively, the through silicon via 20 may transmit the data signal, and the bonding wire 67 may transmit the power supply signal or the ground signal. The semiconductor chip 320 may have more signal transmission paths.

Figure 17:
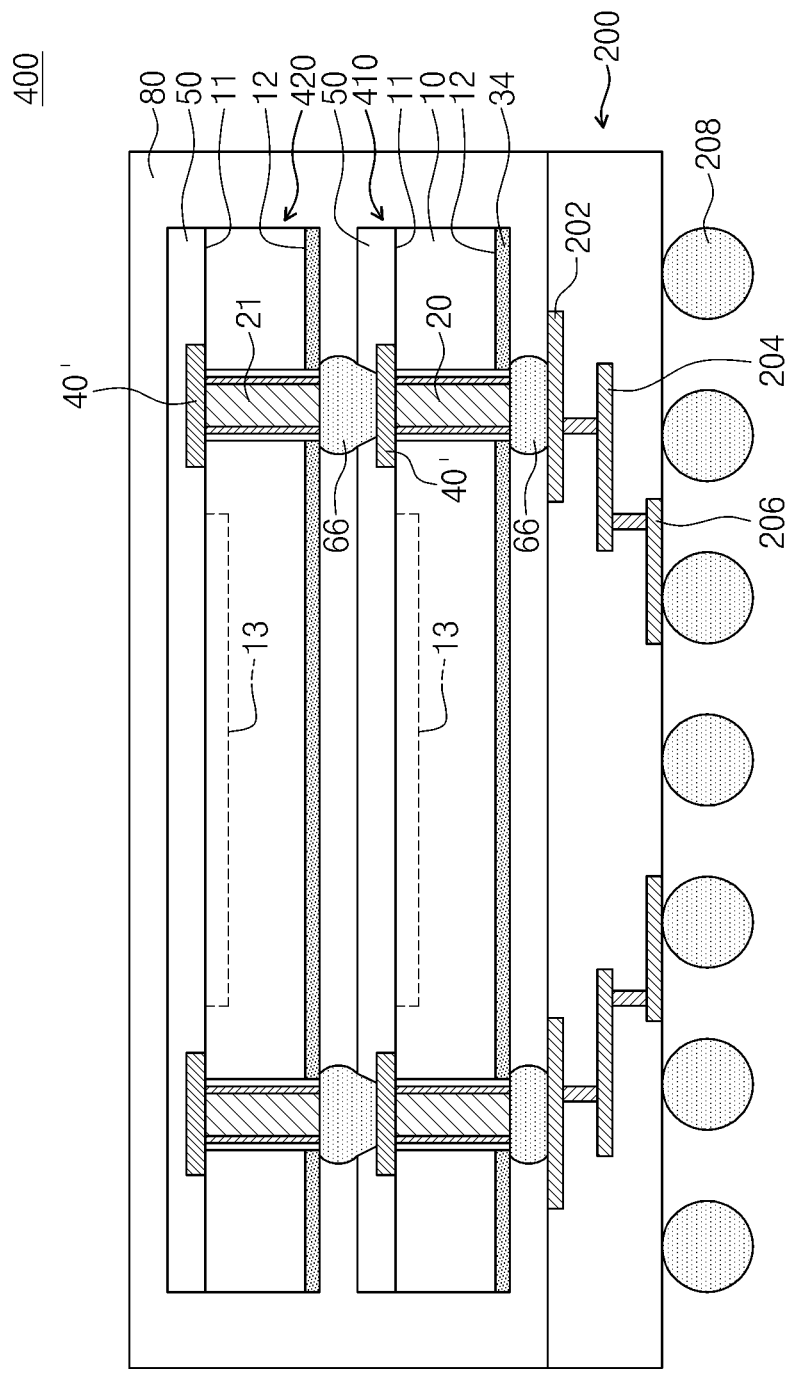
FIGS. 17 through 19 are cross sectional views of semiconductor packages in accordance with embodiments of the inventive concept.
Figure 18:
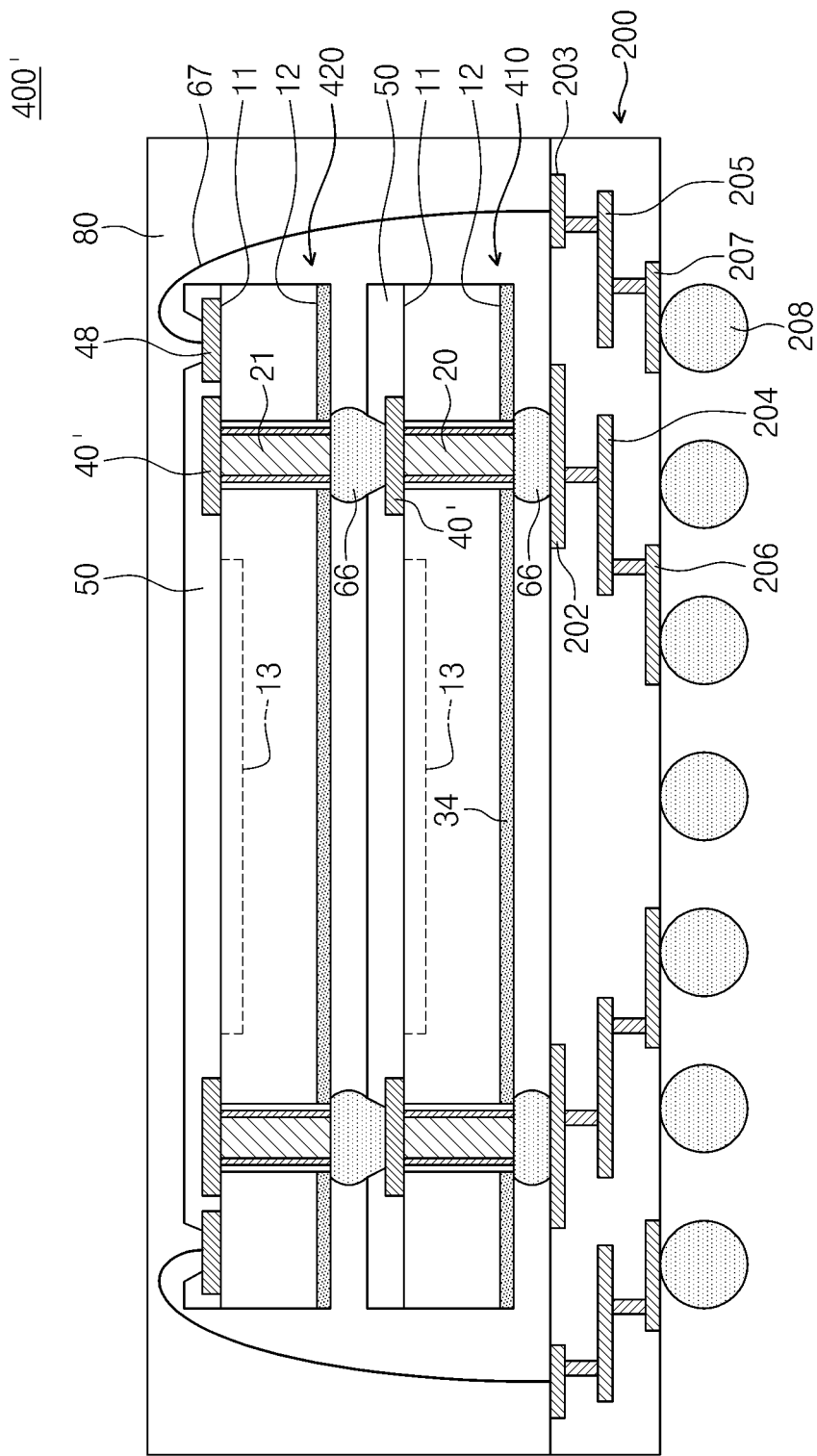
Figure 19:
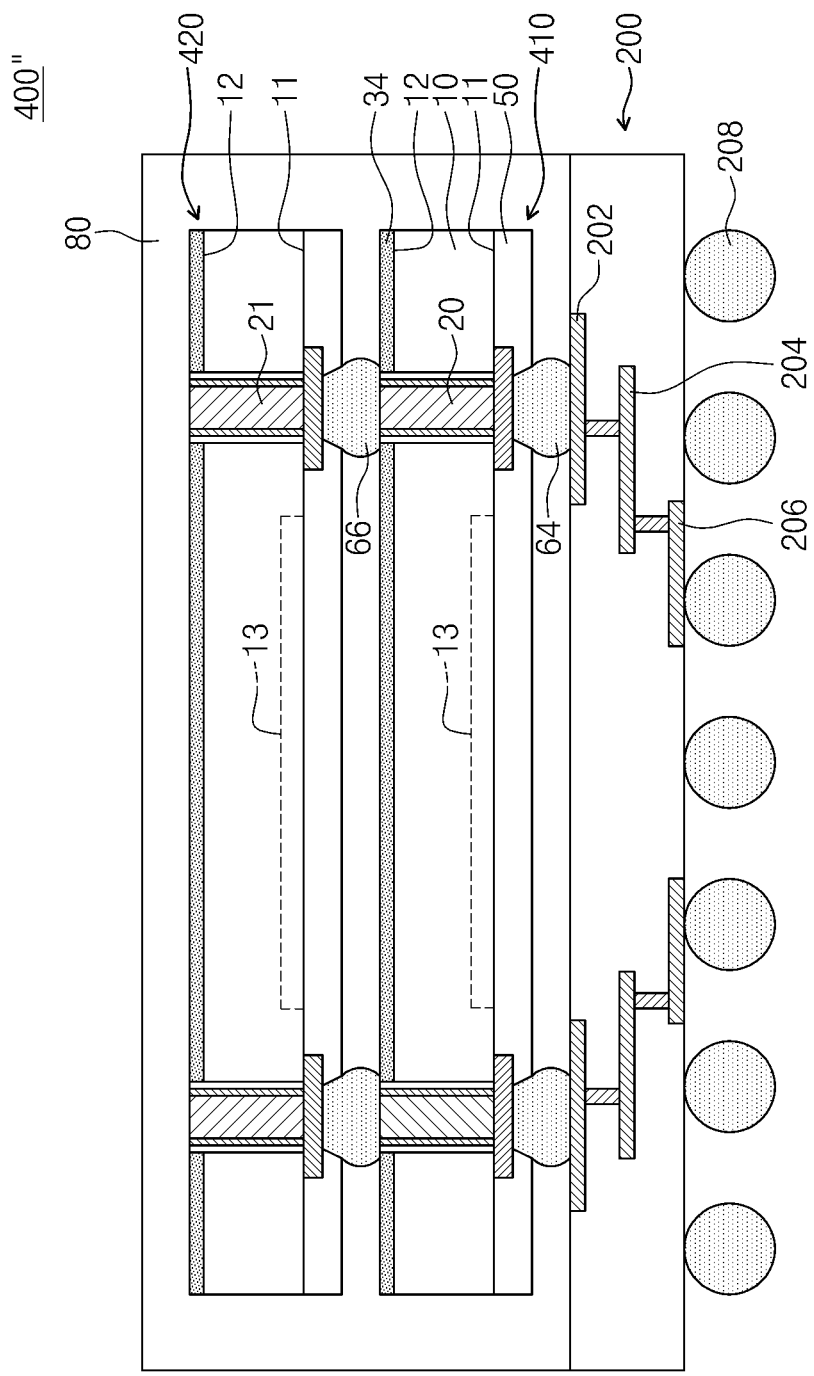

FIGS. 17 through 19 are cross sectional views of semiconductor packages in accordance with embodiments of the inventive concept.

Referring to FIG. 17, a multichip package 400 in accordance with an embodiment of the inventive concept is described. The semiconductor device shown in FIG. 13 may be applied to semiconductor chips 410 and 420 of the multichip package 400. The multichip package 400 may include a package substrate 200, a first semiconductor chip 410 on the package substrate 200, and at least one second semiconductor chip 420 on the first semiconductor chip 410. The first and second semiconductor chips 410 and 420 may be the same type of semiconductor chip. For example, the first semiconductor chip 410 and the second semiconductor chip 420 may be a memory chip fabricated using the same process. The first semiconductor chip 410 and the second semiconductor chip 420 each may include an integrated circuit 13 in which a memory circuit is formed. The first semiconductor chip 410 and the second semiconductor chip 420 may include a first through silicon via 20 and a second through silicon via 21, respectively. The first semiconductor chip 410 and the second semiconductor chip 420 may be formed to overlap each other. The second through silicon via 21 may directly contact the first through silicon via 20. The first through silicon via 20 and the second through silicon via 21 may be connected to each other through a first interconnection layer 40', a connecting pad (62 of FIG. 14), and/or a second connecting terminal 66 between the first and second through vias 20 and 21.

Referring to FIG. 18, a semiconductor package 400' in accordance with a modified example of the semiconductor package 400 described with reference to FIG. 17 is described.

A first semiconductor chip 410 and a second semiconductor chip 420 may include a first through silicon via 20 and a second through silicon via 21, respectively. The first through silicon via 20 and the second through silicon via 21 may be connected to overlap each other. A portion of an integrated circuit 13 of the second semiconductor chip 420 may be electrically connected to the second through silicon via 21 through an internal interconnection and a first interconnection layer 40'. A portion of the integrated circuit 13 of the second semiconductor chip 420 may be electrically connected to a bonding wire 67 through the internal interconnection and a second interconnection layer 48. The first interconnection layer 40' and a second insulating film 50 may have the same structure as those described with reference to FIG. 13. A portion of the second interconnection layer 48 may be exposed by the second insulating film 50 and may be connected to the bonding wire 67. The second semiconductor chip 420 may be electrically connected to the second circuit pattern 205 of the package substrate 200 through the bonding wire 67.

A signal transmitted through the through silicon vias 20 and 21 may be different from a signal transmitted through the bonding wire 67. For example, the through silicon vias 20 and 21 may transmit a power supply signal or a ground signal, and the bonding wire 67 may transmit a data signal. Alternatively, the through silicon vias 20 and 21 may transmit the data signal, and the bonding wire 67 may transmit the power supply or the ground signal. The semiconductor chips 410 and 420 may have more signal transmission paths.

Referring to FIG. 19, a semiconductor package 400" in accordance with a modified example of the semiconductor package 400 described with reference to FIG. 17 is described. A first semiconductor chip 410 and a second semiconductor chip 420 may be mounted on a package substrate 200 so that first sides 11 of the first and second semiconductor chips 410 and 420 face the package substrate 200. The first semiconductor chip 410 may be connected to a bonding pad 202 of the package substrate 200 through a connecting terminal 64.

Figure 20:
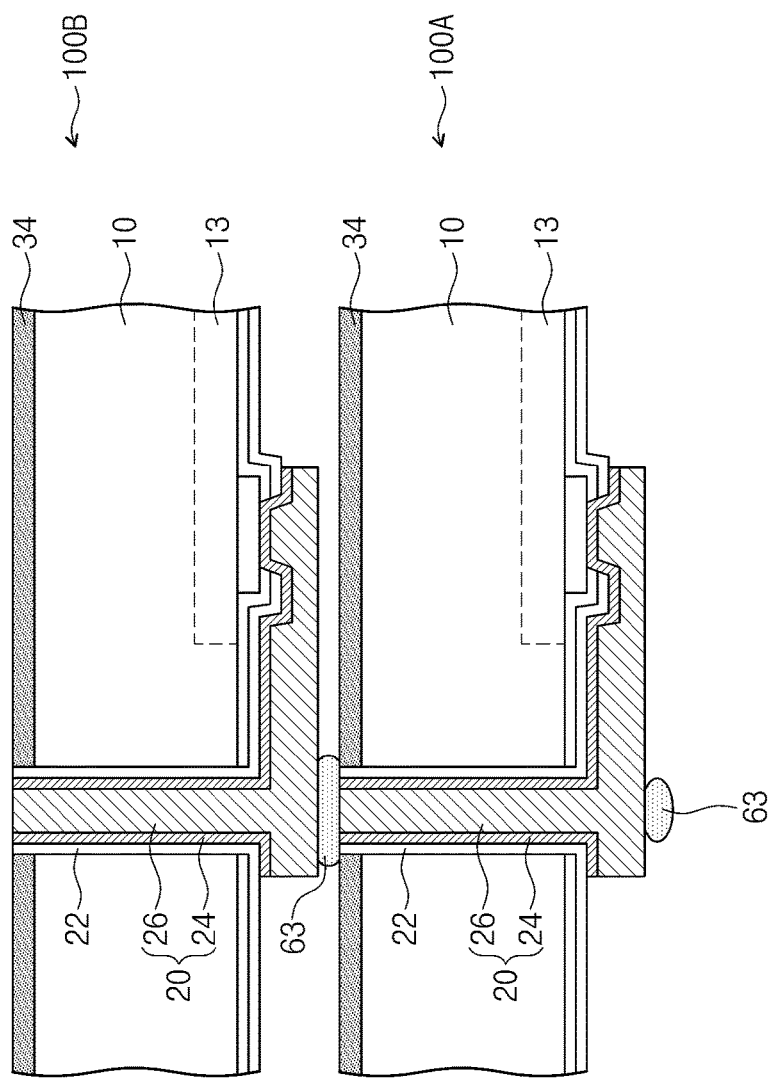
FIG. 20 is a cross sectional view of a semiconductor package in accordance with an embodiment of the inventive concept.

FIG. 20 is a cross sectional view of a semiconductor package where semiconductor devices in accordance with an embodiment of the inventive concept are stacked.

Referring to FIG. 20, a first semiconductor device 100A and a second semiconductor device 100B are stacked so that a through silicon via 20 of the first semiconductor device 100A is vertically aligned with a through silicon via 20 of the second semiconductor device 100B. The through silicon via 20 of the first semiconductor device 100A and the through silicon via 20 of the second semiconductor device 100B may be connected to each other by a connecting pattern 63. A gap between the first semiconductor device 100A and the second semiconductor device 100B may be filled with an insulating filling (not shown).

The stacked semiconductor devices may be mounted on a package substrate (200 of FIG. 19). The package substrate 200 may be a tape interconnection substrate, a ceramic interconnection substrate or a silicon interconnection substrate, etc. The package substrate 200 may include an interconnection pattern (204 of FIG. 19) which extends in a direction parallel with a surface of the package substrate 200 in the package substrate 200, a bonding pad (202 of FIG. 19) formed on a surface of the package substrate 200 and electrically connected to the interconnection pattern (204 of FIG. 19), and a ball pad (206 of FIG. 19) formed on another surface of the package substrate 200 and electrically connected to the interconnection pattern (204 of FIG. 19). The semiconductor devices 100A and 100B or a semiconductor device on which the semiconductor devices 100A and 100B are stacked may be mounted on the package substrate (200 of FIG. 19) while a connecting pattern 63 of the semiconductor device 100A is connected to the bonding pad (202 of FIG. 19) of the package substrate (200 of FIG. 19).

Figure 21:
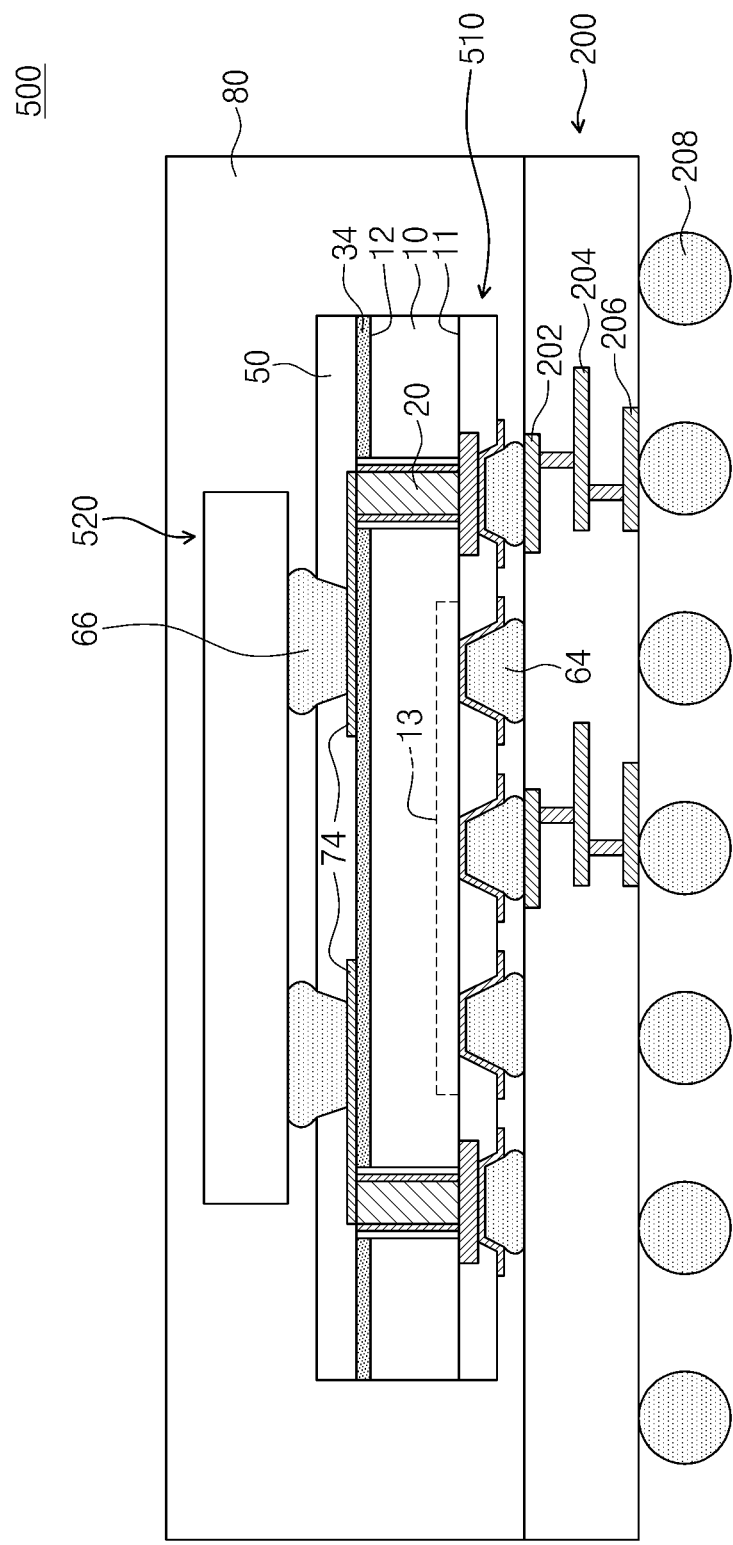
FIGS. 21 and 22 are cross sectional views of semiconductor packages in accordance with embodiments of the inventive concept.
Figure 22:
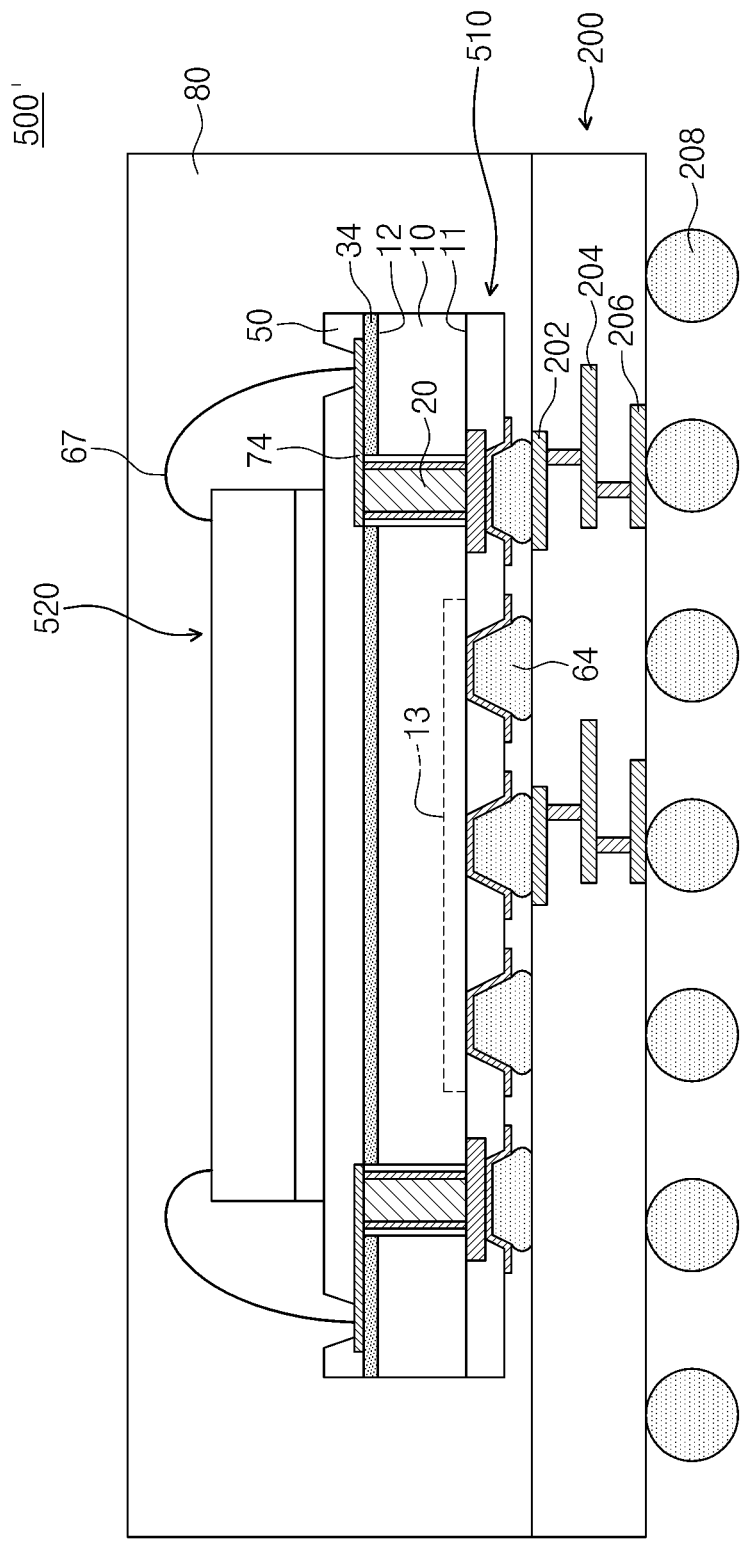

FIGS. 21 and 22 are cross sectional views of semiconductor packages in accordance with embodiments of the inventive concept.

Referring to FIG. 21, a semiconductor package 500 in accordance with an embodiment may be a system in package. The semiconductor device described with reference to FIG. 13 may be applied to a first semiconductor chip 510 of the system in package 500. A second semiconductor chip 520 may be stacked on the first semiconductor chip 510. The second semiconductor chip 520 may be a semiconductor chip which is different in type from the first semiconductor chip 510. For example, the first semiconductor chip 510 may include a logic circuit, and the second semiconductor chip 520 may include a memory circuit. The second semiconductor chip 520 may be a high performance memory chip for assisting an operation of the first semiconductor chip 510.

The first semiconductor chip 510 may be mounted on a package substrate 200 so that a first surface 11 of the first semiconductor chip 510 faces the package substrate 200. The first surface 11 of the first semiconductor chip 510 may further include a plurality of first connecting terminals 64. Some of the first connecting terminals 64 are connected to through silicon vias 20, and some of the first connecting terminals 64 may be connected to an integrated circuit 13 formed in the first semiconductor chip 510. The integrated circuit 13 may be directly connected to the package substrate 200 through the first connecting terminal 64. The integrated circuit 13 may be connected to the semiconductor chip 520 through the through silicon via 20.

The second semiconductor chip 520 may be connected to the package substrate 200 through the through silicon via 20 and the first connecting terminal 64. The second semiconductor chip 520 may be connected to the first semiconductor chip 510 through second connecting terminals 66 formed on one surface of the second semiconductor chip 520. The second connecting terminal 66 may be one selected from the group consisting of a conductive bump, a solder ball, a conductive spacer, a pin grid array, and combinations thereof. The second connecting terminal 66 and the through silicon via 20 may be connected to each other through a fifth interconnection pattern 74 for a redistributed line. For example, when a distance between adjacent second connecting terminals 66 and a distance between adjacent through silicon vias 20 are different from each other, the second connecting terminal 66 and the through silicon via 20 may be connected to each other through the fifth interconnection pattern 74.

Referring to FIG. 22, a semiconductor package 500' in accordance with a modified example of the semiconductor package 500 described with reference to FIG. 21 is described.

A portion of a fifth interconnection pattern 74 may be exposed by a second insulating film 50. A second semiconductor chip 520 may be electrically connected to the fifth interconnection pattern 74 through a bonding wire 67. A first semiconductor chip 510 and the second semiconductor chip 520 may be connected to each other through the bonding wire 67. The bonding wire 67 may be directly connected to a through silicon via 20 or may be connected to the through silicon via 20 through the fifth interconnection pattern 74 for a redistributed line.

Figure 23:
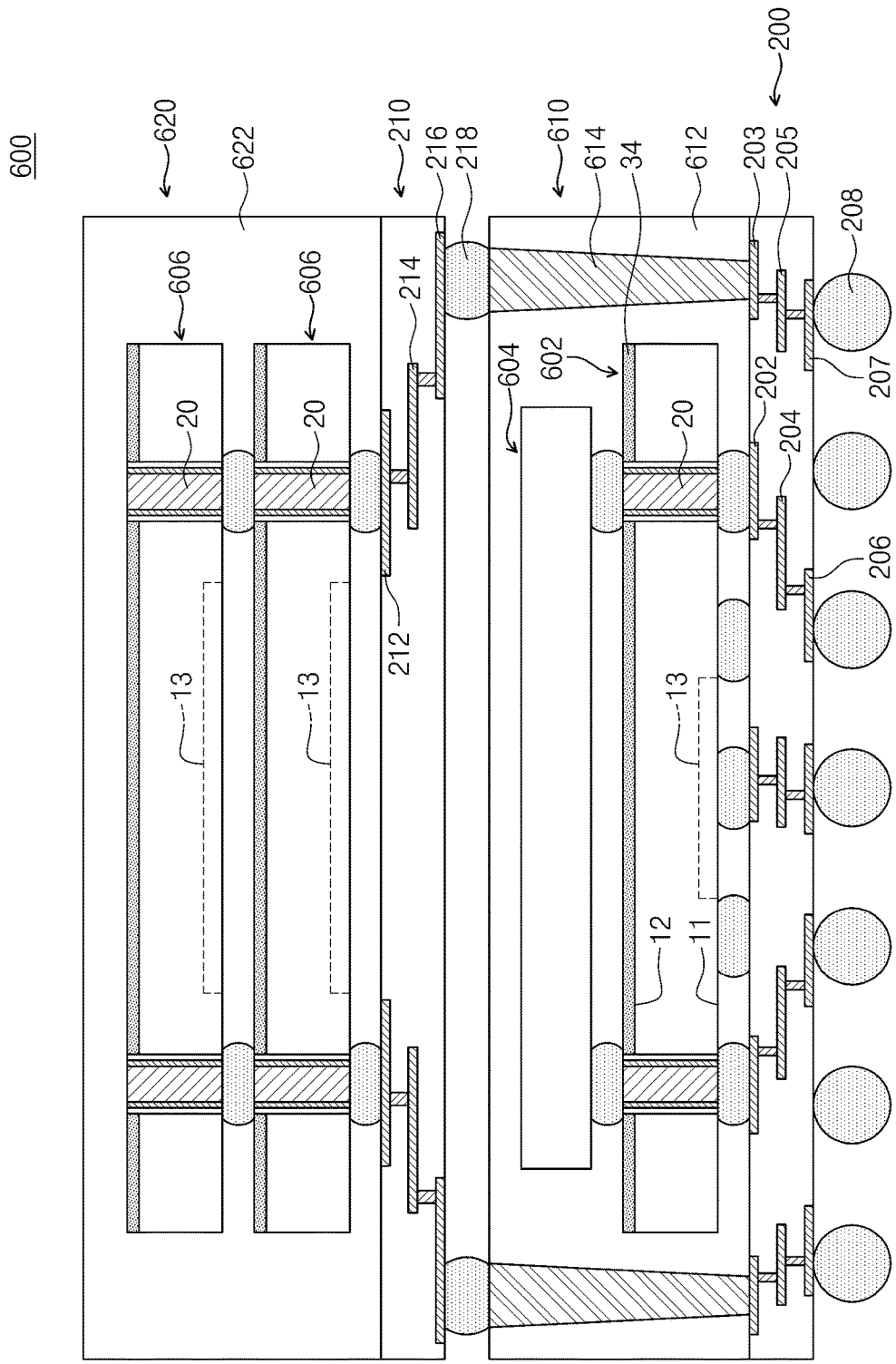
FIG. 23 is a cross sectional view of a semiconductor package in accordance with an embodiment of the inventive concept.

FIG. 23 is a cross sectional view of a semiconductor package in accordance with an embodiment of the inventive concept.

Referring to FIG. 23, the embodiments described with reference to embodiments of the inventive concept may be applied to a first semiconductor package 610 of a stacked package 600 and/or a second semiconductor package 620 of the stacked package 600.

The first semiconductor package 610 may include a first semiconductor chip 602 on a first package substrate 200. The semiconductor device described with reference to FIG. 13 may be applied to the first semiconductor chip 602. The first semiconductor chip package 610 may further include a protective material 612 covering at least a portion of the first semiconductor chip 602 and the first package substrate 200. For example, the protective material 612 may be an underfill material filling a space between a first surface 11 of the first semiconductor chip 602 and the first package substrate 200 or may be a molding structure covering a surface other than the first surface 11 of the first semiconductor chip 602. The molding structure may include an epoxy molding compound. When the protective material 612 is a molding structure, the first semiconductor package 610 may further include a molding electrode 614 penetrating the molding structure. An end of the molding electrode 614 is connected to a second circuit pattern 205 of the first package substrate 200, and the other end of the molding electrode 614 may be exposed to the outside of the protective material 612. The first semiconductor package 610 may further include a second semiconductor chip 604 on the first semiconductor chip 602.

The second semiconductor package 620 may be stacked on the first semiconductor package 610. The second semiconductor package 620 may include a second package substrate 210 and at least one third semiconductor chip 606 on the second package substrate 210. For example, the third semiconductor chip 606 may be a high capacity memory chip. The third semiconductor chips 606 may be connected to each other by through silicon vias 20 formed in the second and third semiconductor chips 620 and 606. The second package substrate 210 may include external connecting terminals 218 on a surface facing the first semiconductor package 610. The external connecting terminal 218 may be in contact with an exposed surface of the molding electrode 614. The second semiconductor package 620 may be connected to an outside through a third circuit pattern 214 of the second package substrate 210, the external connecting terminal 218, the molding electrode 614, and a second circuit pattern 205 of the first package substrate 200. The second circuit pattern 205 of the first package substrate 200 may electrically isolated from the first circuit pattern 204 connected to the first semiconductor chip 602. Since the first semiconductor package 610 and the second semiconductor package 620 performing different functions from each other may be vertically stacked, a mounting area may be reduced compared with when the first and second semiconductor packages 610 and 620 are individually mounted on a module board (702 of FIG. 26) in a subsequent process. The second semiconductor package 620 may further include a protective material covering at least a portion of the second package substrate 210 and the third semiconductor chip 606. For example, the protective material 622 may cover at least one third semiconductor chip 606 or may be a underfill material filling a space between an undermost third semiconductor chip 606 and the second package substrate 210.

Figure 24:
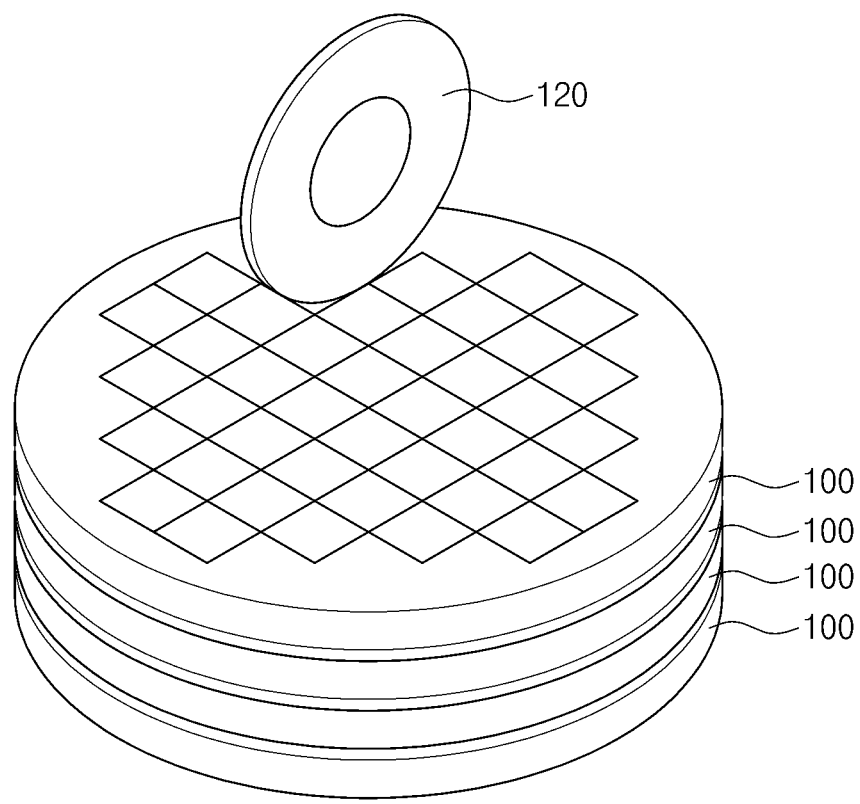
FIGS. 24 and 25 are perspective views illustrating a method of fabricating a semiconductor package in accordance with an embodiment of the inventive concept.
Figure 25:
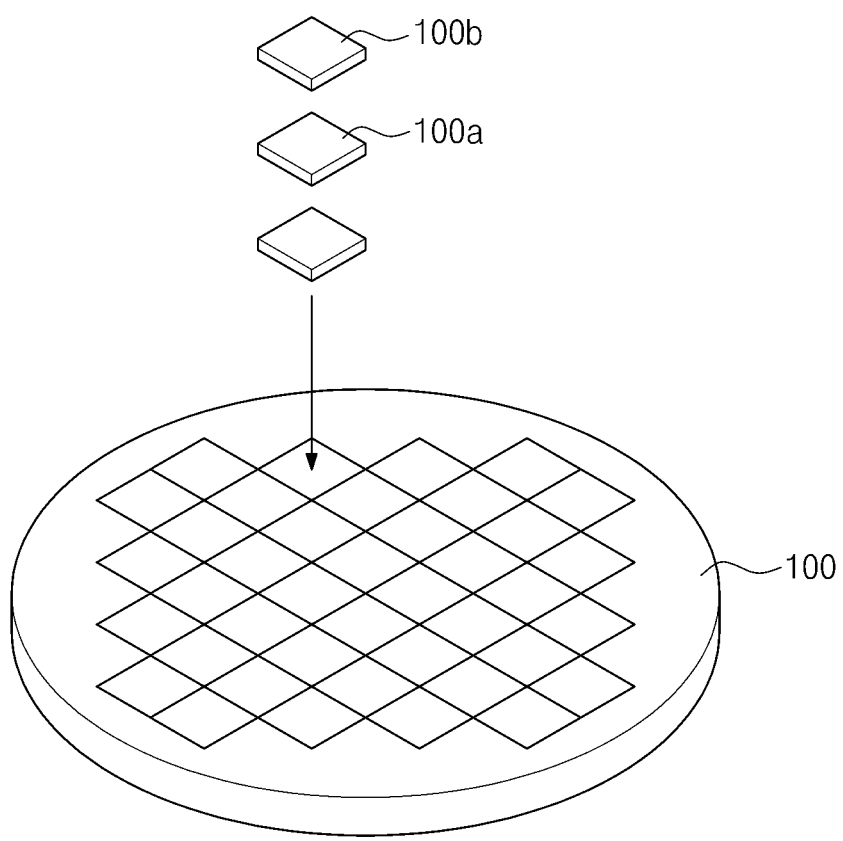

FIGS. 24 and 25 are perspective views illustrating a method of fabricating a semiconductor package in accordance with an embodiment of the inventive concept.

Referring to FIG. 24, a plurality of semiconductor wafers 100 in which semiconductor devices obtained through the semiconductor fabricating methods illustrated in FIGS. 6 through 12 are formed may be stacked on each other. The plurality of the semiconductor wafers 100 stacked are cut along scribe lanes of the semiconductor devices. As a result, the wafers 100 may be divided into individual semiconductor packages. Cutting may be performed using a cutter 120 or a laser.

As illustrated in FIG. 25, a semiconductor package may be formed by stacking individual semiconductor devices, such as semiconductor devices 100a and 100b, on the semiconductor wafer 100. A semiconductor package may also be formed by stacking a plurality of individual semiconductor devices, such as semiconductor devices 100a and 100b, obtained by cutting the semiconductor wafer 100 along scribe lanes of the semiconductor devices.

Figure 26:
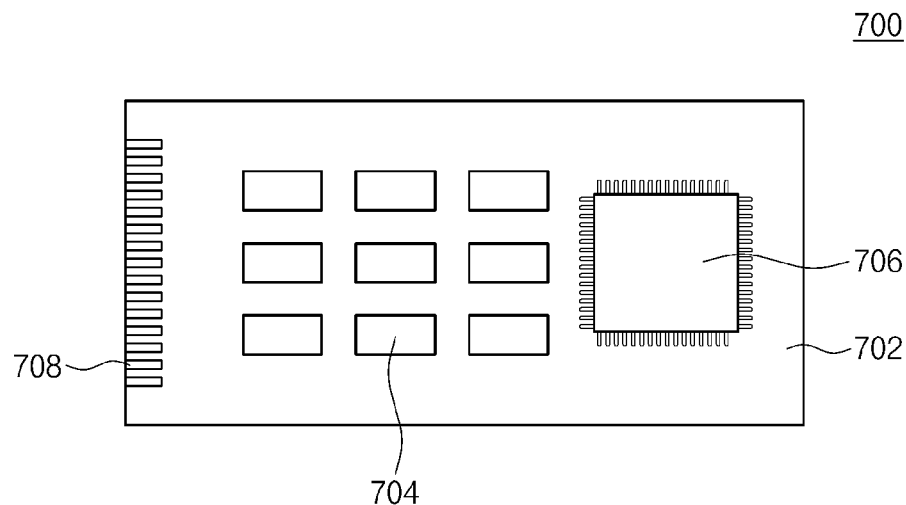
FIG. 26 is a top plan view illustrating a package module in accordance with an embodiment of the inventive concept.

FIG. 26 is a top plan view illustrating a package module in accordance with an embodiment of the inventive concept.

Referring to FIG. 26, a package module 700 may include a module substrate 702 including external connecting terminals 708, and semiconductor chips 704 and a semiconductor package 706, such as a QFP (quad flat package), that are mounted on the module substrate 702. The semiconductor chip 704 and/or the semiconductor package 706 may include a semiconductor device in accordance with an embodiment of the inventive concept. The package module 700 may be connected to an external electronic device through the external connecting terminal 708.

Figure 27:
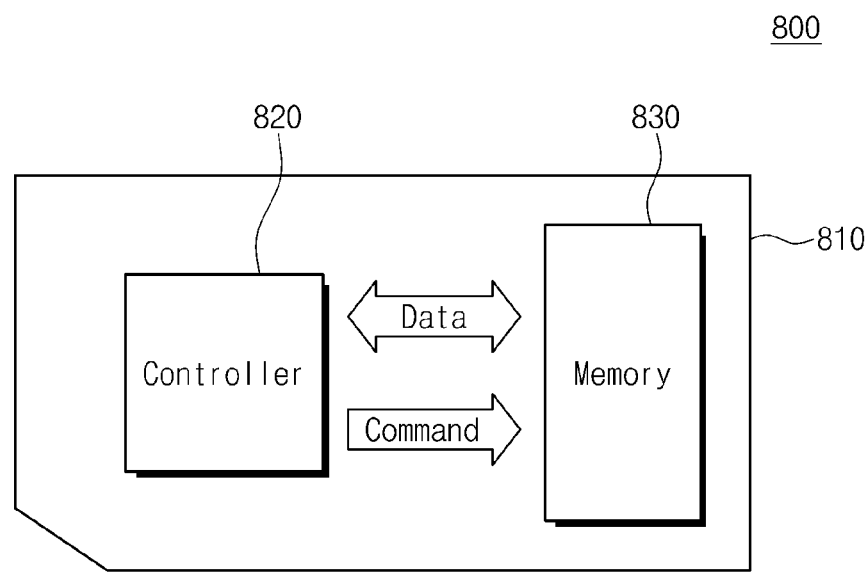
FIG. 27 is a block diagram illustrating a memory card in accordance with an embodiment of the inventive concept.

FIG. 27 is a block diagram illustrating a memory card in accordance with an embodiment of the inventive concept.

Referring to FIG. 27, a card 800 may include a controller 820 and a memory 830 in a housing 810. The controller 820 and the memory 830 may exchange an electric signal with each other. For example, the memory 830 and the controller 820 may exchange data with each other according to a command of the controller 820. Thus, the memory card 800 may store data in the memory 830 or may output data from the memory 830.

The controller 820 and/or the memory 830 may include at least one of a semiconductor device or a semiconductor package in accordance with an embodiment of the inventive concept. For example, the controller 820 may include a system in package (500 of FIG. 21 or 500' of FIG. 22), and the memory 830 may include a multichip package (400 of FIG. 17, 400' of FIG. 18 or 400" of FIG. 19). The controller 820 and/or the memory 830 may be provided in a stacked package type (600 of FIG. 23). The memory card 800 may be used as a data storage medium for various portable devices. For example, the memory card 800 may include a multi media card (MMC) or a secure digital (SD) card.

Figure 28:
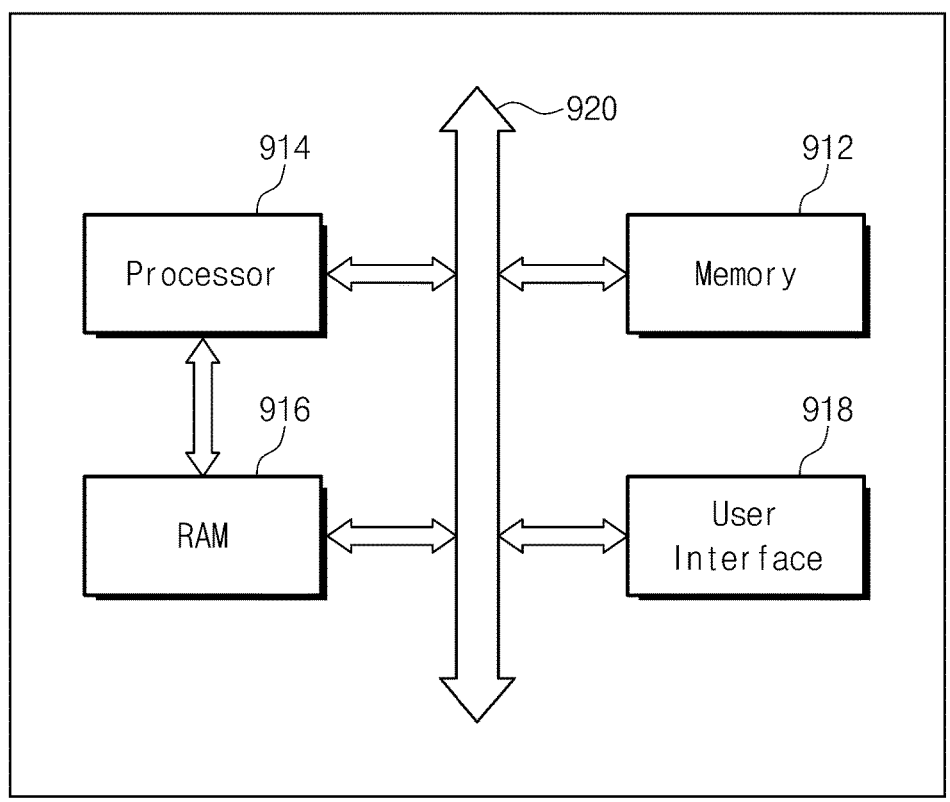
FIG. 28 is a block diagram illustrating an electronic system in accordance with an embodiment of the inventive concept.

FIG. 28 is a block diagram illustrating an electronic system in accordance with an embodiment of the inventive concept.

Referring to FIG. 28, an electronic system 900 may include at least one of a semiconductor device and a semiconductor package in accordance with an embodiment of the inventive concept. The electronic system 900 may include a mobile device or a computer. For example, the electronic system 900 may include a memory system 912, a processor 914, a RAM 916, and a user interface 918 that can exchange data with one another using a bus 920. The processor 914 may execute a program and may control the electronic system 900. The RAM 916 may be used as an operation memory of the processor 914. For example, the processor 914 and the RAM 916 may include a semiconductor device or a semiconductor package in accordance with an embodiment of the inventive concept. The processor 914 and the RAM 916 may be included in one package. The user interface 918 may be used to input data in the electronic system 900 or to output data from the electronic system 900. The memory system 912 may store a code for an operation of the processor 914, data processed by the processor 914, or data input from the outside. The memory system 912 may include a controller and a memory, and may be the same as the memory card 800 of FIG. 27.

Figure 29:
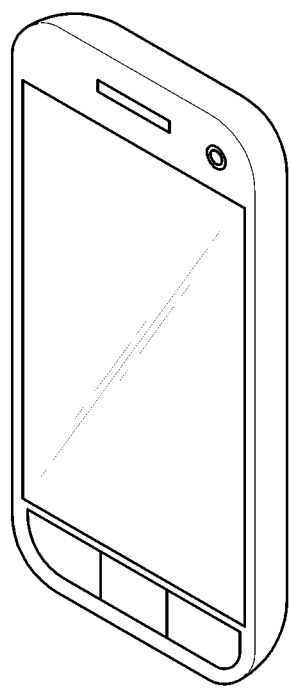
FIG. 29 is a perspective view of an electronic device in accordance with an embodiment of the inventive concept.

The electronic system 900 may be applied to various electronic devices. FIG. 29 illustrates an example in which the electronic system 900 is applied to a mobile phone 1000. According to other embodiments, the electronic system 900 may be applied to a portable notebook, a MP3 player, a navigation system, a solid state disk (SSD), a vehicle, or home appliances.

Although embodiments of the present inventive concept have been shown and described, it will be appreciated by those skilled in the art that changes may be made in these embodiments without departing from the principles and spirit of the general inventive concept, the scope of which is defined in the appended claims and their equivalents. Therefore, the above-disclosed subject matter is to be considered illustrative, and not restrictive.

What is claimed is:

1. A method of fabricating a semiconductor device comprising:
    preparing a substrate having a first surface and a second surface;
    forming a via hole exposing at least a portion of the substrate from the first surface of the substrate;
    forming a first insulating film on an inner wall of the via hole;
    forming a conductive connection part filling an inside of the via hole including the first insulating film;
    polishing the second surface of the substrate until the conductive connection part is exposed; and
    selectively forming a second insulating film on the second surface of the substrate except for the exposed conductive connection part, wherein an end of the second insulating film extends beyond an edge of the inner wall of the via hole toward the conductive connection part, and
    wherein forming the second insulating film is performed using an electrografting method.

2. The method of claim 1, wherein the second insulating film is polyvinyl-based material.

3. The method of claim 1, wherein the first insulating film comprises at least one selected from a silicon oxide, a silicon oxynitride, a silicon nitride, a polymer, and combinations thereof.

4. The method of claim 1, wherein the first insulating film comprises a CF-based polymer.

5. The method of claim 1, further comprising forming a barrier film on the first insulating film.

6. The method of claim 1, further comprising forming an integrated circuit on the first surface of the substrate.

7. The method of claim 1, further comprising forming a conductive bump electrically connected to the conductive connection part at the second surface of the substrate.

8. A method of fabricating a semiconductor device comprising:
    preparing a substrate having an integrated circuit;
    forming a pad on a top surface of the substrate, wherein the pad is connected to the integrated circuit;
    forming a via hole through the top surface of the substrate at a predetermined depth;
    forming a first insulating film on an inner wall of the via hole;
    forming a conductive connection part that fills the via hole and extends on the top surface to be connected to the pad;
    exposing the conductive connection part; and
    forming a second insulating film on a bottom surface of the substrate except for the exposed connection part,
    wherein an end of the second insulating film extends toward the conductive connection part,
    wherein the first insulating film extends beyond the bottom surface of the substrate past the conductive connection part, and
    wherein forming the second insulating film is performed using an electrografting method.

9. The method of claim 8, further comprising: forming a barrier film between the conductive connection part and the first insulating film.

10. The method of claim 8, wherein exposing the conductive connection part includes polishing the bottom surface to expose the first insulating film and selectively etching the bottom surface.

* * * * *